(12) United States Patent
Takahashi et al.

(10) Patent No.: US 7,541,236 B2
(45) Date of Patent: Jun. 2, 2009

(54) METHOD FOR MANUFACTURING SEMICONDUCTOR DEVICE

(75) Inventors: Koji Takahashi, Omura (JP); Shinichi Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 215 days.

(21) Appl. No.: 11/019,549

(22) Filed: Dec. 23, 2004

(65) Prior Publication Data

US 2006/0008995 A1    Jan. 12, 2006

(30) Foreign Application Priority Data

Jul. 6, 2004    (JP) ............................. 2004-198888

(51) Int. Cl.
*H01L 21/8238*    (2006.01)
(52) U.S. Cl. ................. 438/201; 438/258; 257/E21.689
(58) Field of Classification Search ................. 438/201, 438/258; 257/E21.683, E21.686, E21.689
See application file for complete search history.

(56) References Cited

U.S. PATENT DOCUMENTS

| | | | |
|---|---|---|---|
| 4,646,425 A * | 3/1987 | Owens et al. ................. 438/201 |
| 5,292,681 A * | 3/1994 | Lee et al. ..................... 438/201 |
| 5,329,228 A | 7/1994 | Comeau | |
| 7,202,540 B2 | 4/2007 | Komori et al. | |
| 2005/0230714 A1 | 10/2005 | Komori et al. | |
| 2007/0114617 A1 | 5/2007 | Komori et al. | |
| 2007/0117303 A1 | 5/2007 | Komori et al. | |

FOREIGN PATENT DOCUMENTS

| | | |
|---|---|---|
| JP | 5-504442 A | 7/1993 |
| JP | 05-315922 A | 11/1993 |
| JP | 10-32255 A | 2/1998 |
| JP | 2001-015718 A | 1/2001 |
| JP | 2004-95910 A | 3/2004 |

OTHER PUBLICATIONS

Patent Abstracts of Japan Publication No. 07183502 dated Jul. 21, 1995.
Patent Abstracts of Japan Publication No. 2002043446 dated Feb. 8, 2002.
Japanese Office Action dated Jul. 1, 2008 issued in corresponding Application No. 2004-198888.
Japanese Office Action dated Jul. 6, 2009 issued in corresponding Application No. 2004-198888.

* cited by examiner

*Primary Examiner*—Chandra Chaudhari
(74) *Attorney, Agent, or Firm*—Westerman, Hattori, Daniels & Adrian, LLP.

(57) ABSTRACT

On a surface of a Si substrate, a nonvolatile memory cell, an nMOS transistor, and a pMOS transistor are formed, and thereafter an interlayer insulation film covering the nonvolatile memory cell, the nMOS transistor, and the pMOS transistor is formed. Next, in the interlayer insulation film, there are formed plural contact plugs connected respectively to a control gate of the nonvolatile memory cell, a source or a drain of the nMOS transistor, and a source or a drain of the PMOS transistor. Thereafter, there is formed a single-layer wiring connecting the control gate to the sources or drains of the nMOS transistor and the pMOS transistor via the plural contact plugs.

13 Claims, 41 Drawing Sheets

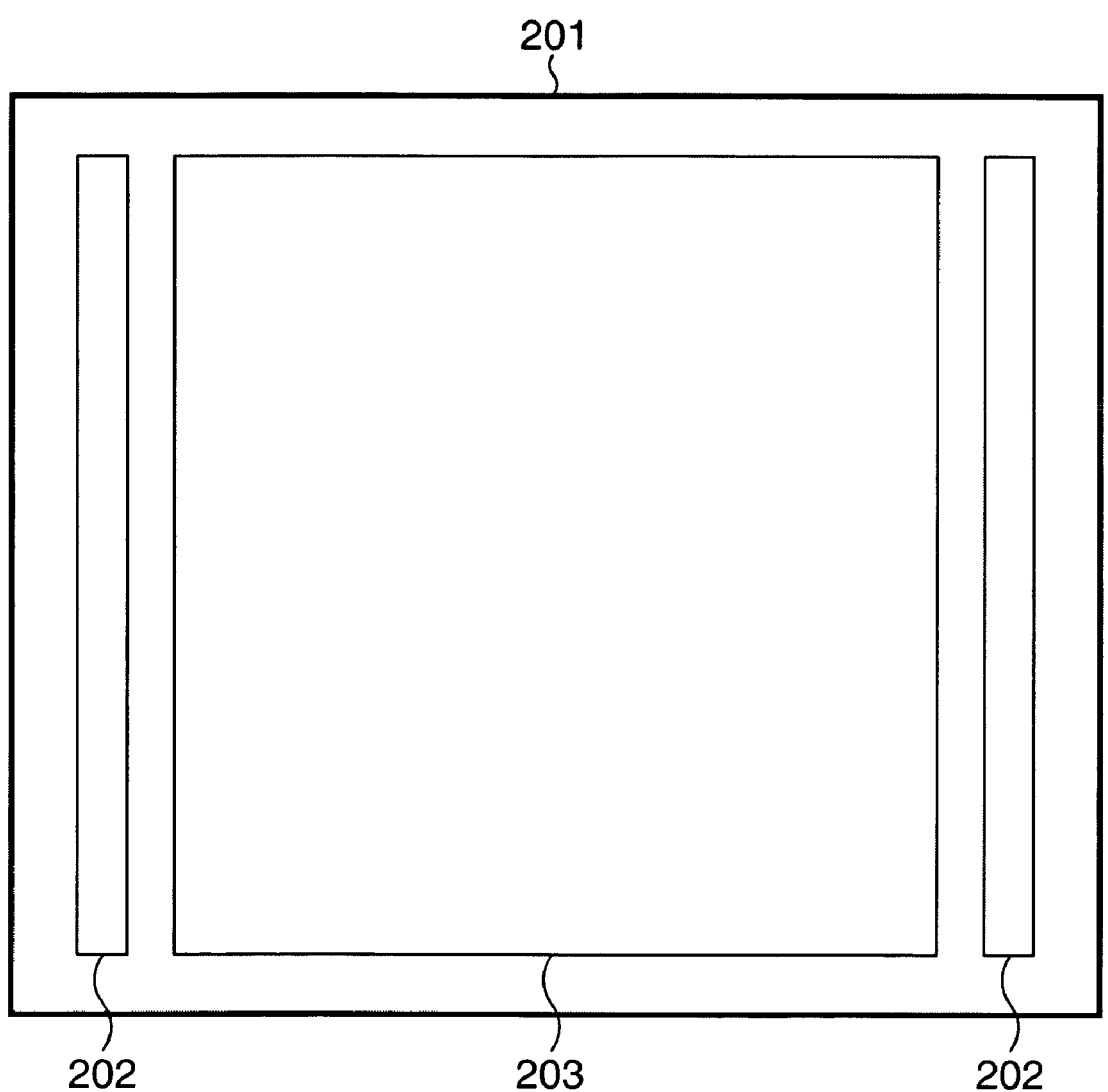

n+/pw (gated) 310 p+/nw (gated) 320 n+/pw p+/nw

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2004-198888, filed on Jul. 6, 2004, the entire contents of which are incorporated herein by reference.

BACKGROUND OF THE INVENTION

1. Field of the Invention

The present invention relates to a method for manufacturing a semiconductor device having, for example, a field-effect transistor.

2. Description of the Related Art

When a nonvolatile memory such as a flash memory and the like is manufactured, there is a problem that variation of threshold voltage (Vth) tends to occur after wafer processing thereof is completed. A main cause of such occurrence is estimated that unnecessary electric charges are injected into a floating gate in wafer processing.

Conventionally, in order to cope with this problem, there is proposed an art in which a control gate is connected via plural wirings to a so-called protective diode at manufacturing a flash memory, as disclosed in Patent Document 1 and Patent Document 2.

[Patent Document 1] Japanese Patent Application Laid-open No. 2002-43446

[Patent Document 2] Japanese Patent Application Laid-open No. Hei 7-183502

However, even with these conventional manufacturing methods, it is impossible to sufficiently restrain the threshold voltage variation resulting from the injection of the electric charges into the floating gate at manufacturing.

SUMMARY OF THE INVENTION

The present invention is made in view of the above-described problem, and its object is to enable further restraint of the threshold voltage variation resulting from the injection of electric charges into the floating gate and to provide a manufacturing method to attain a reliable and high-performance semiconductor device.

The inventors of the present application have come up with various aspects of the invention described below as a result of assiduous study for solving the above-described problems.

In a method for manufacturing a semiconductor device according to the present invention, on a surface of a semiconductor substrate, a nonvolatile memory cell, an nMOS transistor, and a pMOS transistor are formed, and thereafter an interlayer insulation film covering the nonvolatile memory cell, the nMOS transistor, and the pMOS transistor is formed. Next, in the interlayer insulation film, there are formed a plurality of contact plugs connected respectively to a control gate of the nonvolatile memory cell, a source or a drain of the nMOS transistor, and a source or a drain of the pMOS transistor. Thereafter, there is formed a wiring connecting the control gate to the sources or the drains of the nMOS transistor and the pMOS transistor via the plurality of contact plugs.

BRIEF DESCRIPTION OF THE DRAWINGS

FIG. 11 is a layout view showing an entire semiconductor device manufactured by a method according to an embodiment of the present invention;

DETAILED DESCRIPTION OF THE PREFERRED EMBODIMENTS

Basic Gist of the Present Invention

First, a basic gist of the present invention will be described.

Figure 1:
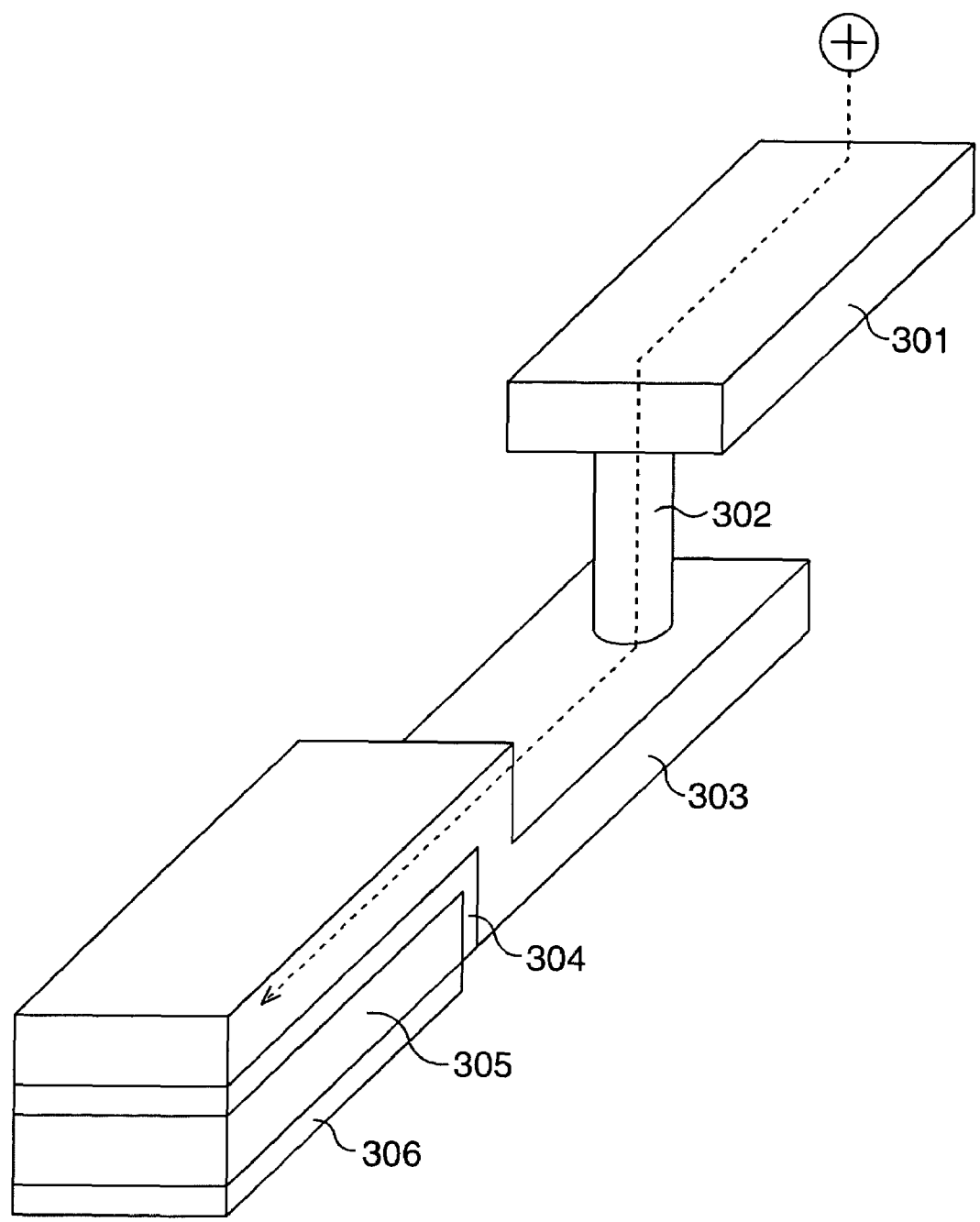
FIG. 1 is a schematic view showing a movement of a hole.
Figure 2:
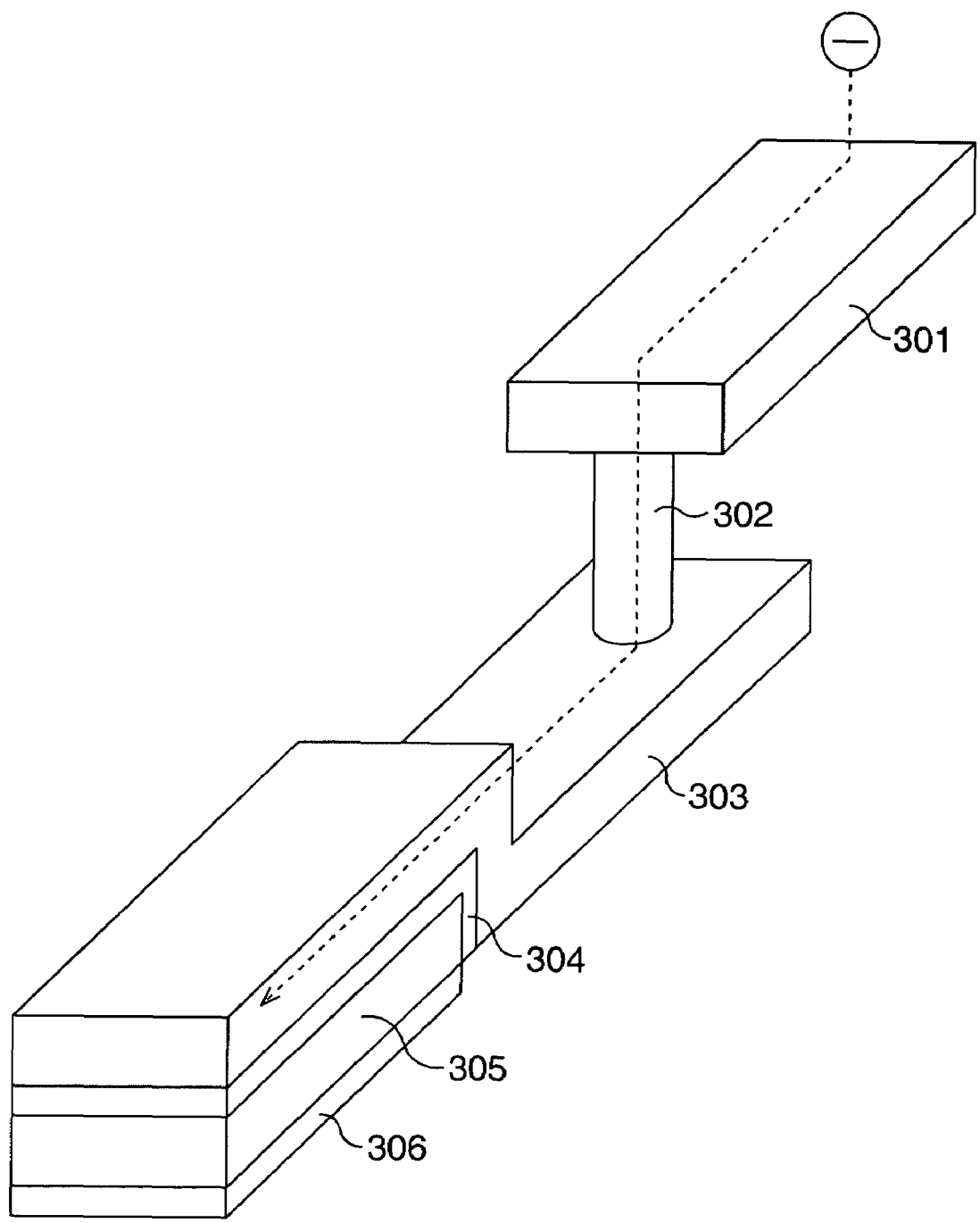
FIG. 2 is a schematic view showing a movement of an electron.
Figure 3:
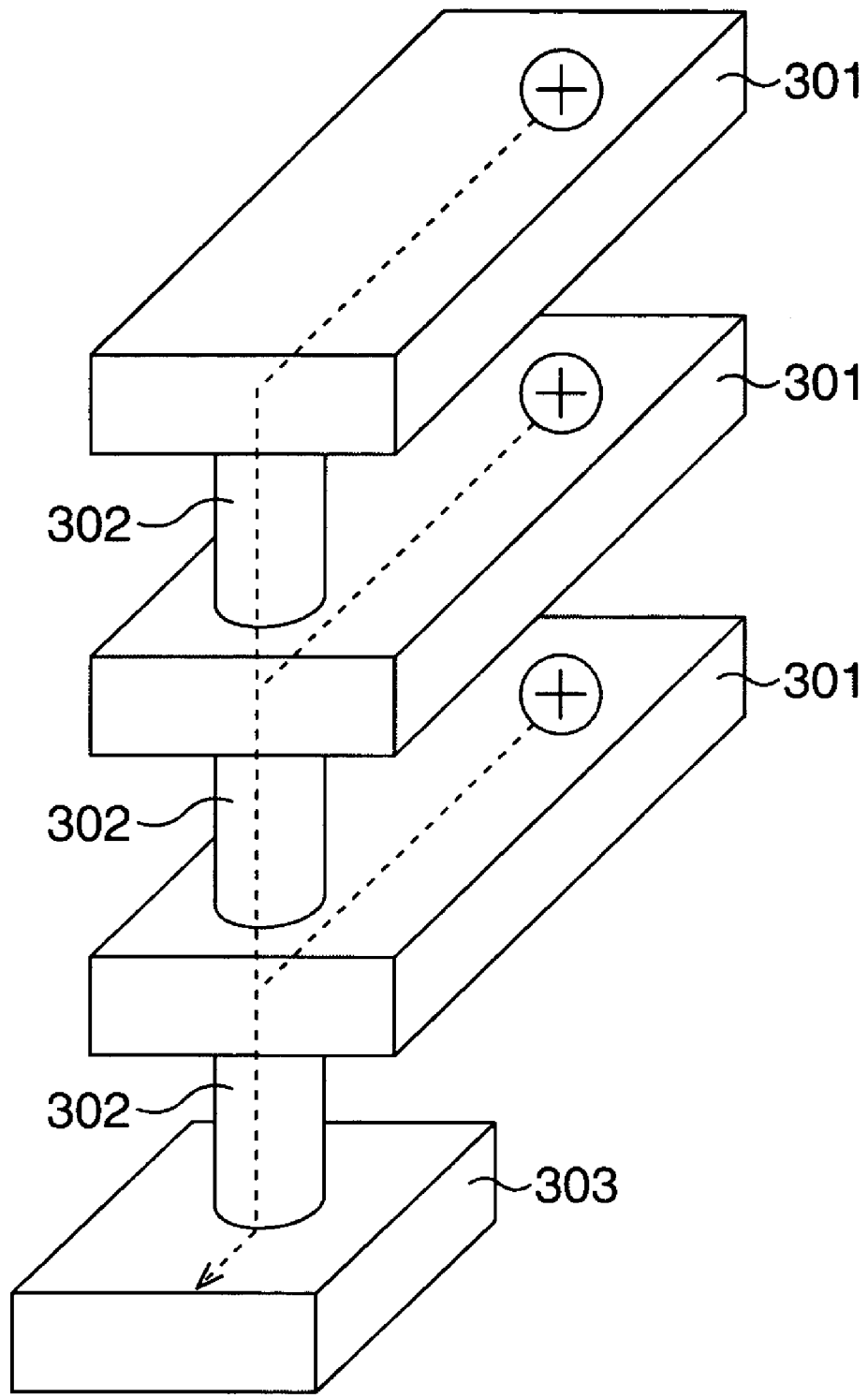
FIG. 3 is a schematic view showing an increase in the holes.
Figure 4:
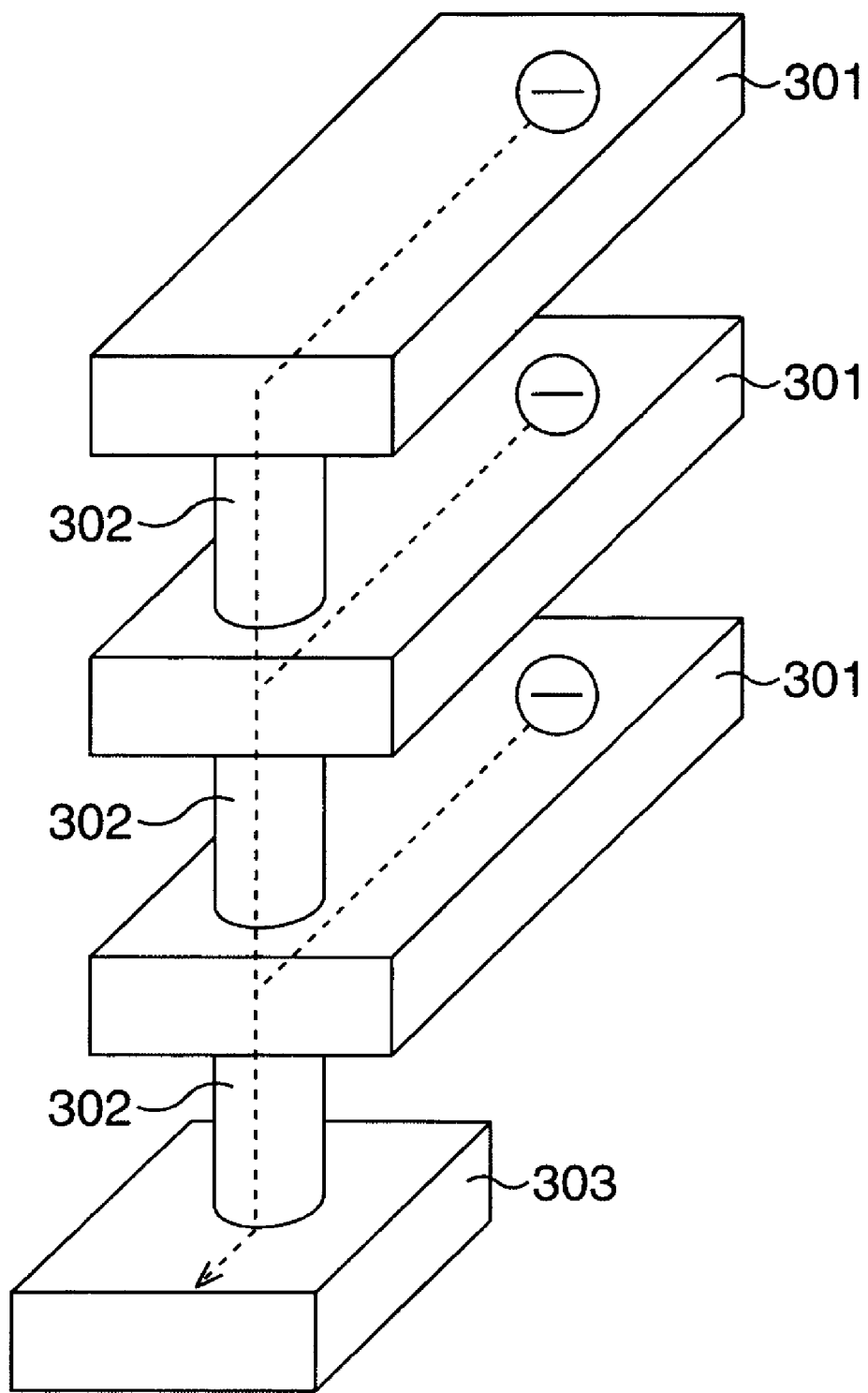
FIG. 4 is a schematic view showing an increase in the electrons.

Problems of conventional method for manufacturing a nonvolatile memory such as a flash memory are considered to be specified as follows. In the manufacturing method, resulting from plasma processing conducted at a time of multilayer wiring formation, an electron or a hole can be stored in a wiring which is connected to a control gate. Electric charges thereof can move to the control gate and unnecessary electric charges can be injected into a floating gate. For example, as shown in FIG. 1, when the hole is stored in a wiring 301, the hole moves via a contact plug 302 to a control gate 303. Similarly, as shown in FIG. 2, when the electron is stored in the wiring 301, the electron moves via the contact plug 302 to the control gate 303. Meanwhile, an electric potential of a Si substrate (not shown) is substantially equal to a ground electric potential. Therefore, a potential difference occurs between the control gate 303 and the Si substrate, and also between the floating gate 305 existing therebetween and the Si substrate, the potential difference occurs. As a result, voltage is applied to a tunnel oxide film 306 which exists between the floating gate 305 and the Si substrate, and when a value thereof exceeds a certain value a tunnel current flows. As shown in FIG. 1, when the control gate 303 is charged to plus, the electron is injected into the floating gate 305 from the Si substrate. As shown in FIG. 2, when the control gate 303 is charged to minus, the electron moves from the floating gate 305 to the Si substrate. An amount of the electric charges which move from the wirings 301 to the control gate 303 increases with a greater number of the wirings 301, as shown in FIG. 3 and FIG. 4.

It is inferred that in a subsequent heat treatment a thermal excitation causes the electric charges which are injected into the floating gate as described the above to move to the tunnel oxide film 306 or an ONO film 304, and then the electric charges are trapped there.

Figure 5A:
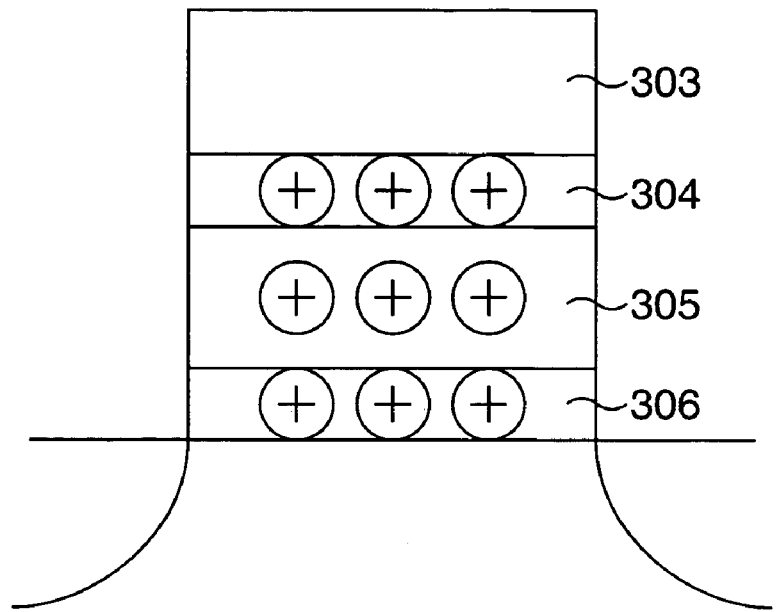
FIG. 5A and FIG. 5B are diagrams showing threshold voltage variation according to a trap of holes.
Figure 5B:
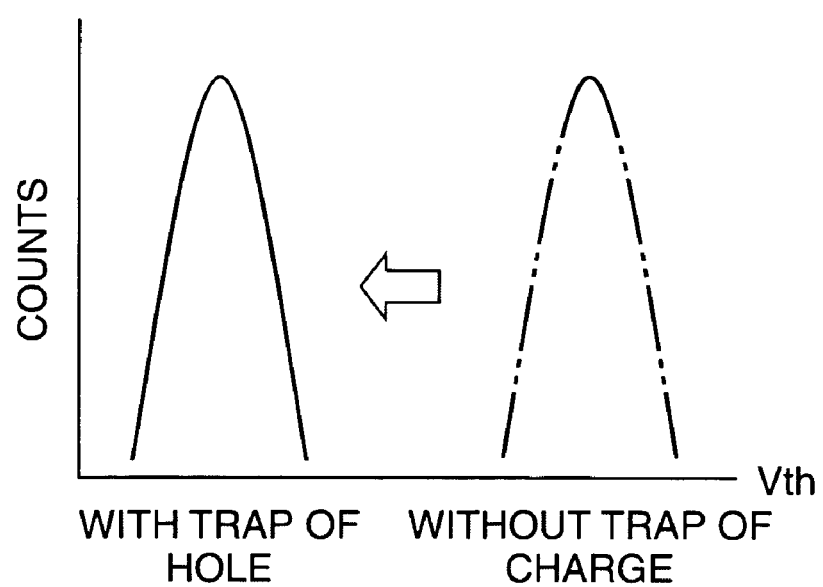
Figure 6A:
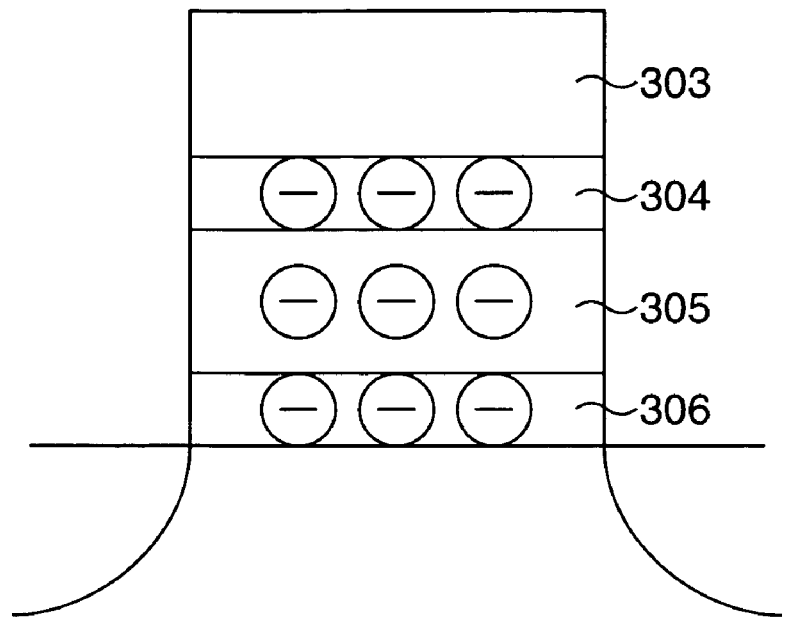
FIG. 6A and FIG. 6B are diagrams showing threshold voltage variation according to a trap of electrons.
Figure 6B:
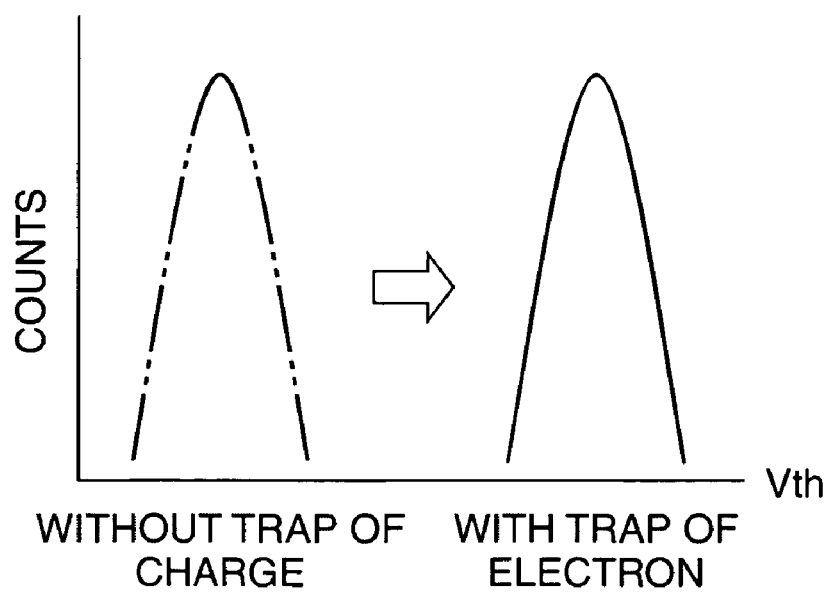

If, as shown in FIG. 5A, the holes are trapped in the ONO film 304, the floating gate 305, and the tunnel oxide film 306, threshold voltage becomes lower compared to when the electric charges are not trapped, as shown in FIG. 5B. If, as shown in FIG. 6A, the electrons are trapped in the ONO film 304, the floating gate 305, and the tunnel oxide film 306, the threshold voltage becomes higher compared to when the electric charges are not trapped, as shown in FIG. 6B. In this manner, the threshold voltage varies.

Figure 7A:
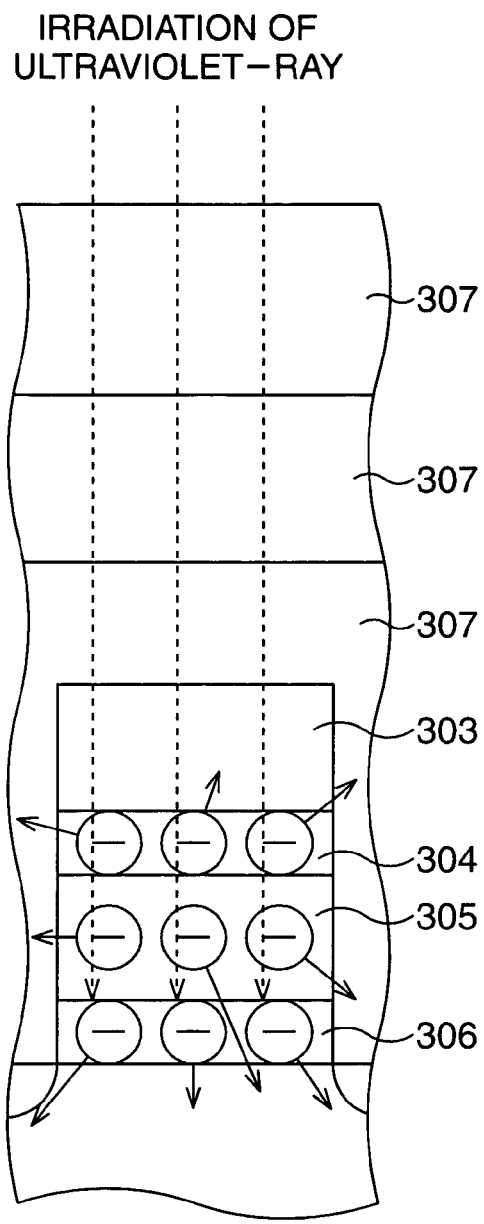
FIG. 7A and FIG. 7B are views showing erase of electric charges by ultraviolet ray irradiation.
Figure 7B:
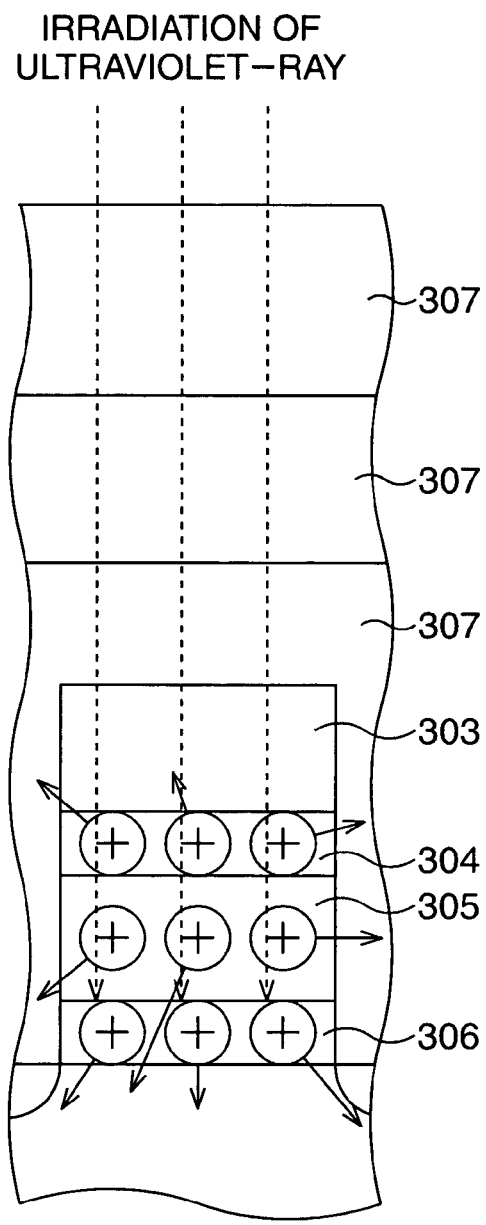

In order to erase the electric charges trapped in the ONO film 304, the floating gate 305, and the tunnel oxide film 306, it can be considered that ultraviolet rays are irradiated to them via plural interlayer insulation films 307 as shown in FIG. 7A and FIG. 7B, but it is very difficult to eliminate electric charges trapped in tunnel oxide film or ONO film.

The present invention offers, in order to reduce wiring resistance of logic interconnection and so on, a semiconductor device which includes a nonvolatile memory cell (for example, a flash memory) and Cu wirings being plural upper wirings connected to a control gate of the nonvolatile memory cell. The present invention also offers, in order to reduce wiring parasitic capacity of logic interconnection and so on, a semiconductor device which includes the nonvolatile memory cell, the plural upper wirings connected to the control gate of the nonvolatile memory cell, and a low dielectric constant film being an interlayer insulation film which covers these upper wirings.

Figure 8A:
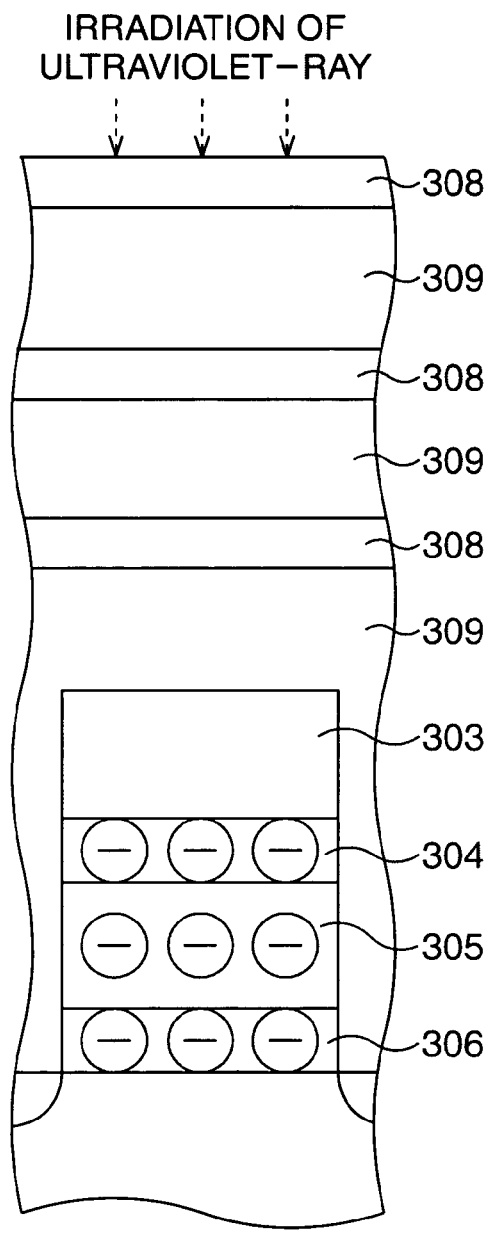
FIG. 8A and FIG. 8B are views showing mechanisms in which electric charges are not erased by the ultraviolet ray irradiation.
Figure 8B:
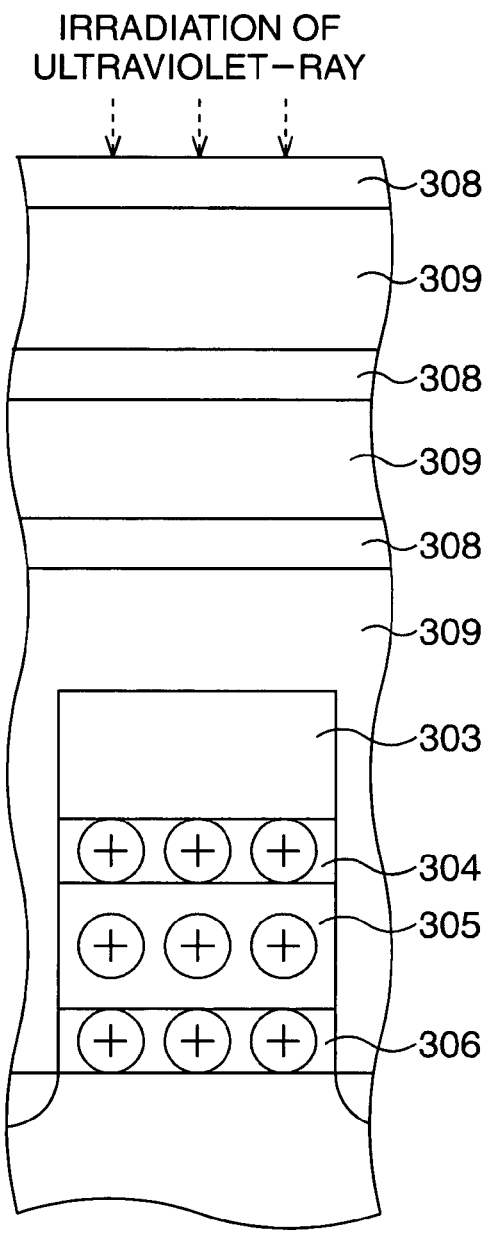

The inventors of the present invention have studied causes why the threshold voltage variation resulting from the electric charge injection into the floating gate cannot be sufficiently restrained in the above-described conventional manufacturing method. It is found, as a consequence, that even by the ultraviolet ray irradiation the electric charges trapped in the floating gate and the like cannot be removed. It is found that even if the ultraviolet rays are irradiated to them via the plural interlayer insulation films 307 as shown in FIG. 7A and FIG. 7B, by Si nitride films 308 for preventing Cu diffusion, which is recently used in a process for miniaturization and the like, ultraviolet ray transmission is obstructed as shown in FIG. 8A and FIG. 8B. Moreover, in such a process, if the low dielectric constant films are used as interlayer insulation films 309 the ultra violet ray irradiation itself is not undesirable since the ultraviolet ray irradiation to the low dielectric constant film can cause decomposition or alteration.

The inventors of the present invention have studied the above-described threshold voltage variation, and further found that the threshold voltage varies when the semiconductor device manufactured by the conventional method is being used.

Figure 9A:
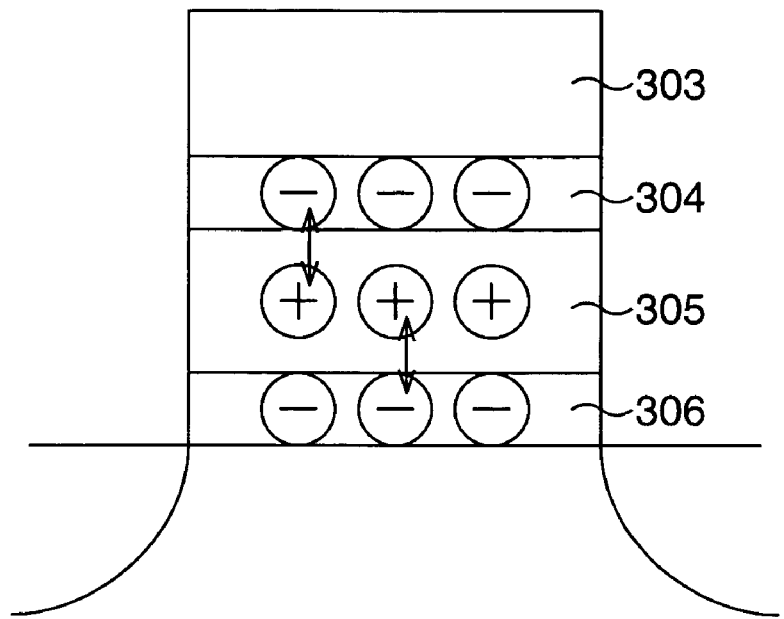
FIG. 9A and FIG. 9B are diagrams showing threshold voltage variation according to movement of holes by heat.
Figure 9B:
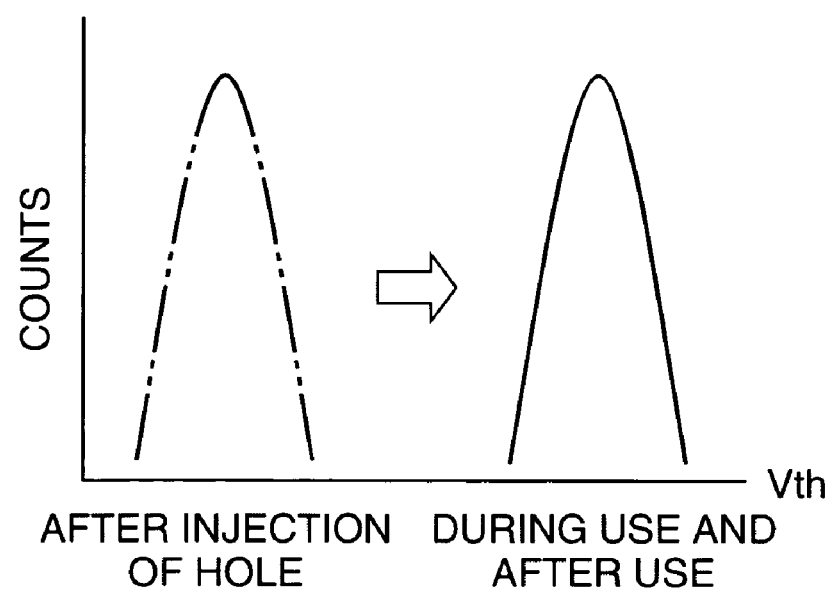

For example, when the nonvolatile memory after manufacturing is used in a state that the electrons are trapped in the ONO film 304 and the tunnel oxide film 306, by heat influence and the like the electrons return to the floating gate 305 or move to the control gate 303. If the electrons in the ONO film 304 returns to the floating gate 305, for example, the threshold voltage rises as shown in FIG. 9B. It is found, more specifically, that the threshold voltage gradually rises with longer operating time. If the electrons in the tunnel oxide film 306 move to the floating gate 305, the threshold voltage gradually rises with longer operating time.

Figure 10A:
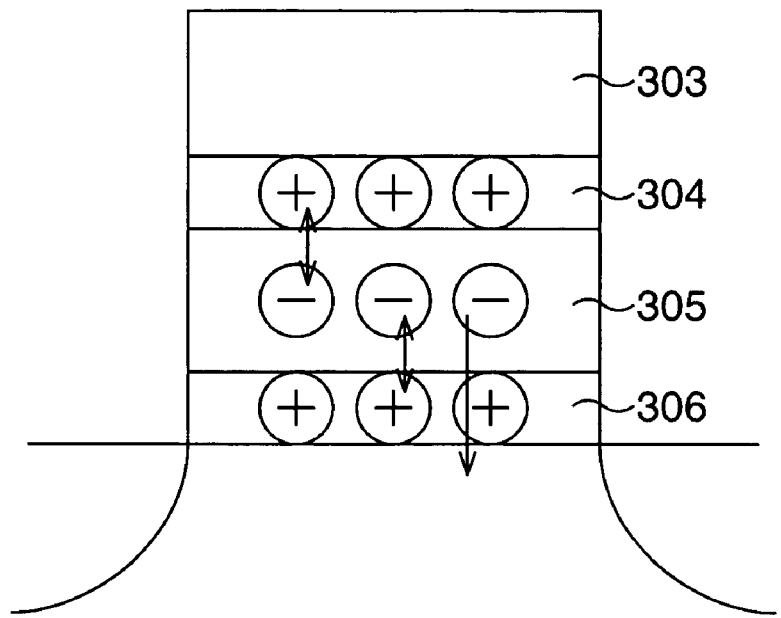
FIG. 10A and FIG. 10B are diagrams showing threshold voltage variation according to movement of electrons by heat.
Figure 10B:
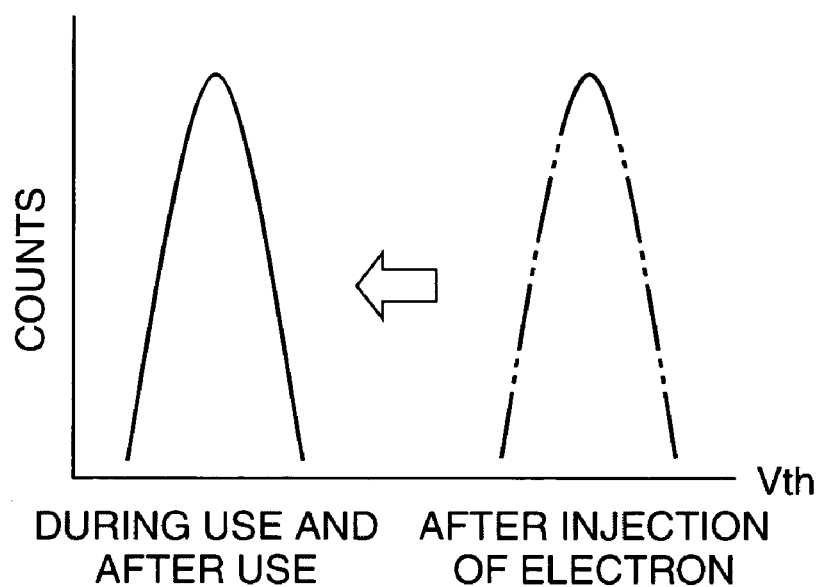

Similarly, when the nonvolatile memory after manufacturing is used in a state that the holes are trapped in the ONO film 304 and the tunnel oxide film 306, by heat influence and the like the holes return to the floating gate 305 or move to the control gate 303. If the holes in the ONO film 304 returns to the floating gate 305, for example, the threshold voltage lowers as shown in FIG. 10B. It is found, more specifically, that the threshold voltage gradually lowers with longer operating time.

Even if the threshold voltage scatters by the stored electric charges in the ONO film 304 and the like just after manufacturing, the threshold voltage can be set to be a desired value by adjusting the electric charges of the floating gate 305 at the time of programming. However, if the threshold voltage varies during operation as described above, the stored information is destroyed and cannot be recovered.

As a result of assiduous study for solving the above-described problems, the inventors of the present invention have conceived that use of an nNOS transistor and a pMOS transistor, for example, as protective diodes can restrain the threshold voltage variation after manufacturing and can also restrain the threshold voltage variation during product operation, even without the ultraviolet ray irradiation.

The present invention offers a manufacturing method of a semiconductor device which has a nonvolatile memory cell (for example, flash memory) and a protective diode formed on a semiconductor substrate surface, and the undermost layer metal wiring which connects a control gate of the nonvolatile memory cell and a diffusion layer of the protective diode.

In a commodity flash memory device, narrow cell pitches are adopted to minimize the cell size by using, for example, self-aligned source line formation process. Even though number of process steps is increased by the self-aligned process, reduced cell size significantly reduces the chip size and makes the total chip cost lower in case of commodity device, because memory cells in a commodity device occupy more than half of the chip area. However, the small word line pitch makes it difficult to connect every word line to corresponding protective diode with the undermost interconnection wiring.

On the other hand, in a semiconductor having an embedded structure, on which the flash memory and a logic circuit, for example, are mounted, flash cells occupy less than 10% of the chip and thus number of process steps is much more important than memory cell size to decrease the chip cost. Therefore, wider cell pitches without self-aligned source line process is preferred. As a consequence, it is allowed to design the intervals between the word lines to be comparatively wider. Accordingly it becomes possible, when connecting one word line to the nMOS transistor and the pMOS transistor, to use a single-layer wiring, for example, the undermost of metal wiring for leading-about.

In this case, without the ultraviolet ray irradiation the threshold voltage variation after manufacturing and the threshold voltage variation during device operation can be restrained. Therefore, it is preferable to apply the present invention to a manufacturing method which requires the Cu wiring and the Si nitride film as the diffusion prevention film thereof, and to a manufacturing method in which the low dielectric constant film is formed as the interlayer insulation film.

Embodiment of the Present Invention

Figure 12:
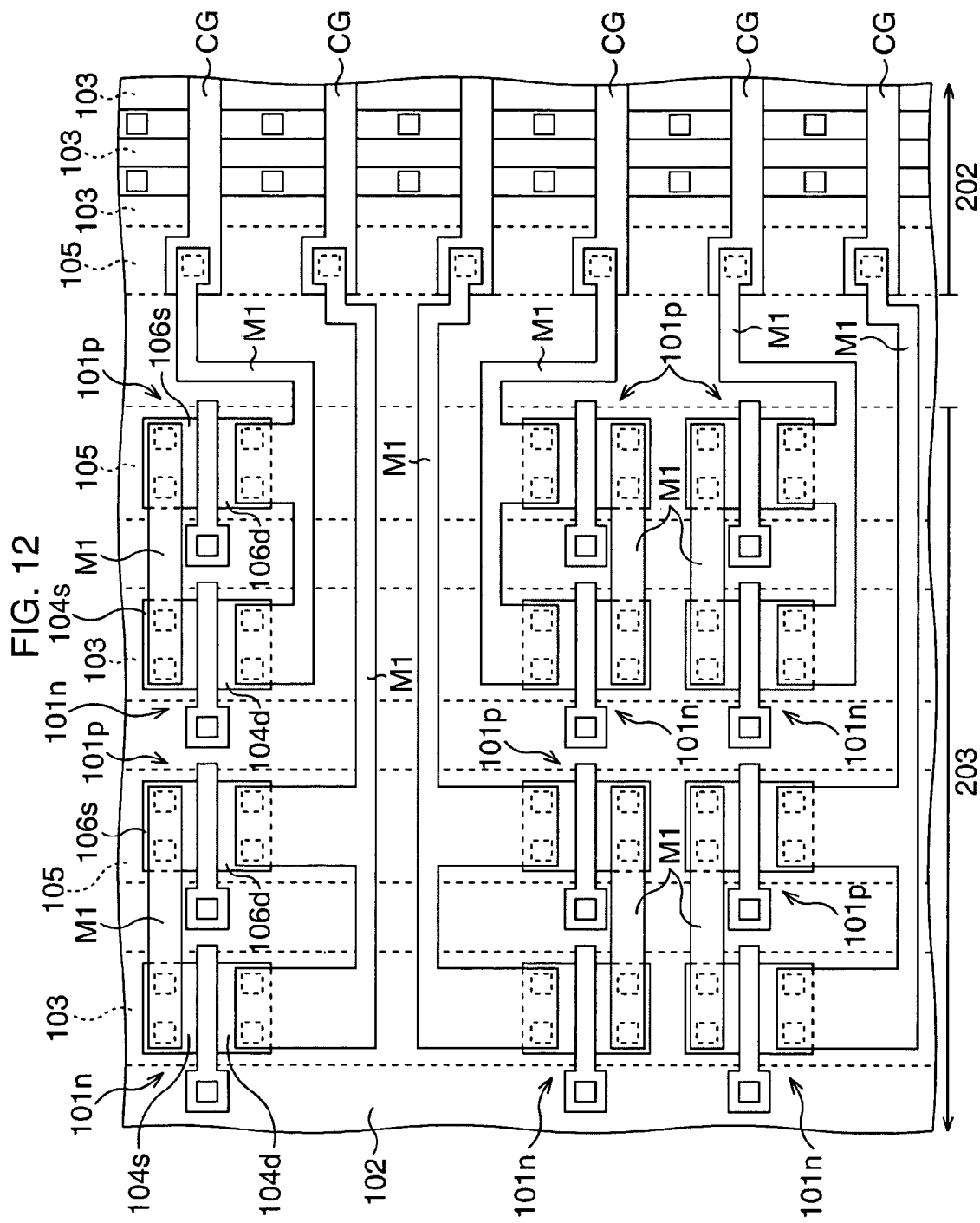
FIG. 12 is a layout view showing in close up a part in FIG. 11.

Hereinafter an embodiment of the present invention will be concretely described with reference to the attached drawings. FIG. 11 is a layout view showing an entire semiconductor device manufactured by a method according to the embodiment of the present invention. FIG. 12 is a layout view showing in close up a part in FIG. 11.

In this semiconductor device, as shown in FIG. 11, inside a die (semiconductor chip) 201, a logic circuit region 203 and a flash memory region 202 are provided. Additionally, this semiconductor device is an embedded type, with the flash memory region 202 being smaller than the logic circuit region 203. An occupied area of the flash memory region 202 is, for example, approximately 2% to 5%.

Additionally, as shown in FIG. 12, in the flash memory region 202, plural flash memory cells having n-type impurity diffused layers as sources and drains are formed in array on p-wells 103. On a periphery of the p-wells 103, an n-well 105 is formed.

Meanwhile, in the logic circuit region 203, neighboring the flash memory region 202, plural pMOS transistors 101$p$ and nMOS transistors 101$n$ which constitute a part of a decoder and function as protective diodes of the flash memory cells are formed. With regard to the pMOS transistors 101$p$, in an element active region divided by an element isolation insulating film 102, the p-wells 103 are formed, inside which sources 104$s$ and drains 104$d$ are formed. With regard to the nMOS transistors 101$n$, in the element active region divided by the element isolation insulating film 102, the n-wells 105 are formed, inside which sources 106$s$ and drains 106$d$ are formed. Additionally, on the element isolation insulating film 102, sources 104$s$ and 106$s$, and drains 104$d$ and 106$d$, an interlayer insulation film (not shown) is formed. Thereon, metal wirings M1 of the undermost layer are formed. The metal wirings M1 are connected to control gates CG in the flash memory region 202 via contact holes.

With regard to a positional relationship between the respective transistors and the wirings, two pairs of pMOS transistors 101$p$ and nMOS transistors 101$n$ (four transistors) are disposed in parallel in a direction that the control gates CG extend. With regard to dispositions of the metal wirings M1, the metal wirings M1 are connected to the sources and drains positioned on the same side of gates of these four transistors. Two transistors which are adjacent in a vertical direction against the direction that the control gates CG extend are line symmetric to each other. Thus every control gate CG is connected to n and p sources or drains by the metal wiring M1.

Next, a method for manufacturing a semiconductor device according to the embodiment of the present invention will be described in detail. FIG. 13 to FIG. 32 are sectional views showing sequential steps of the method for manufacturing the semiconductor according to the embodiment of the present invention. Each drawing of Fig. number having "A" at an end shows a region for forming the nMOS transistor 101$n$ (nMOS region). Each drawing of Fig. number having "B" at the end shows a region for forming the pMOS transistor 101$p$ (pMOS region). Each drawing of Fig. number having "C" at the end shows a region for forming the flash memory (cell region). In FIG. 21 to FIG. 32, each drawing of Fig. number having "D" shows a cross section along a line I-I in each drawing of Fig. number having "C" at the end.

Figure 13A:
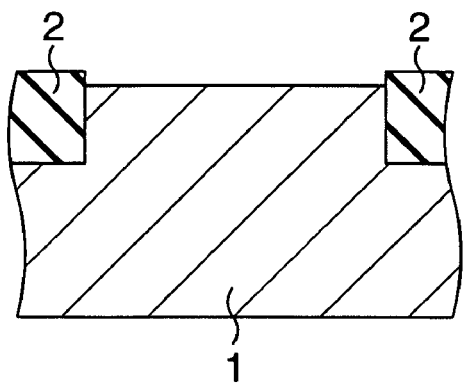
FIG. 13 to FIG. 32 are sectional views showing sequential steps of the method for manufacturing a semiconductor device according to the embodiment of the present invention.
Figure 13B:
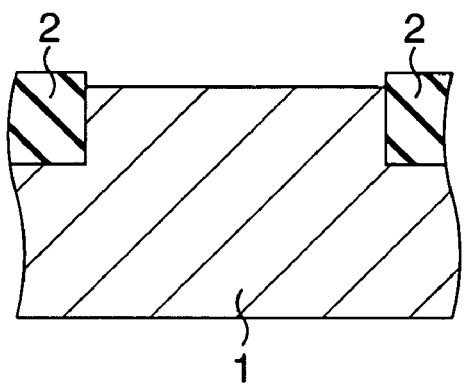
Figure 13C:
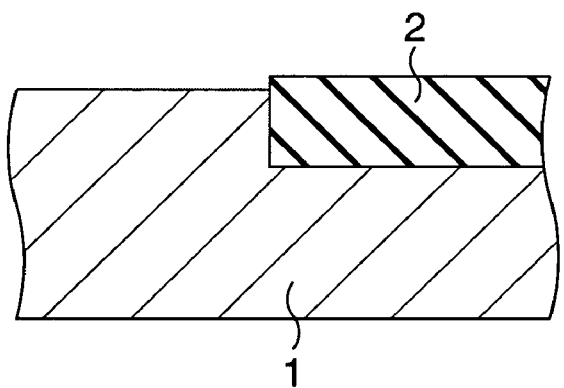

In the present embodiment, first, as shown in FIG. 13A to FIG. 13C, an element isolation insulating film 2 of approximately 250 nm to 400 nm deep is formed on a surface of a p-type Si substrate 1 by STI (Shallow Trench Isolation). At forming the element isolation insulating films 2, for example, trenches are formed on the surface of the Si substrate 1, and in these trenches TEOS (Tetraethylorthosilicate) films or HDP (High Density Plasma) films are embedded as Si oxide films. Then planarization by CMP (Chemical Mechanical Polishing) is conducted.

Figure 14A:
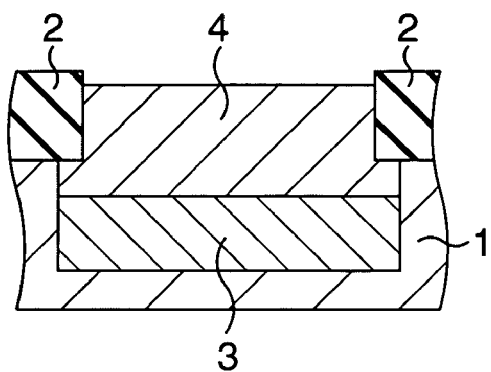
Figure 14B:
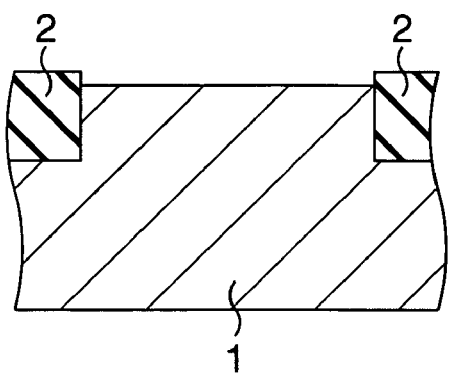
Figure 14C:
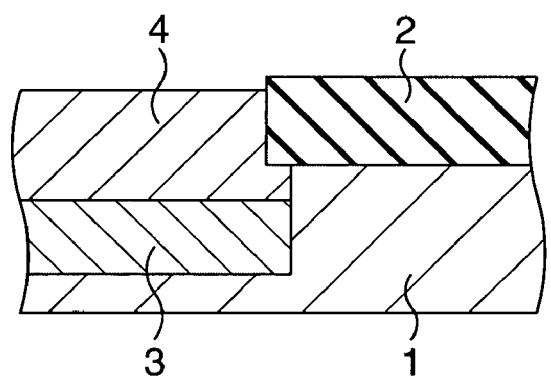

Next, as shown in FIG. 14A to FIG. 14C, in the nMOS region and the cell region, deep n-wells 3 and p-wells 4 are sequentially formed. At forming the deep n-wells 3, phosphorus ions, for example, are ion-implanted under a condition of an energy of 1.5 MeV to 2.5 MeV and a dose amount of $1\times10^{13}$ cm$^{-2}$ to $3\times10^{13}$ cm$^{-2}$. At forming the p-wells 4, boron ions, for example, are ion-implanted under a condition of an energy of 400 keV to 500 keV and an dose amount of $1\times10^{13}$ cm$^{-2}$ to $3\times10^{13}$ cm$^{-2}$. Incidentally, in the present embodiment, a triple-well structure is adopted as described above, and a purpose thereof is to use FN (Fowler-Nordheim) tunneling from the floating gate to the substrate for erasing data in the flash memory cell. Therefore, if erasing is conducted in other ways such as from the floating gate to the source region, it is unnecessary to adopt the triple-well structure.

Figure 15A:
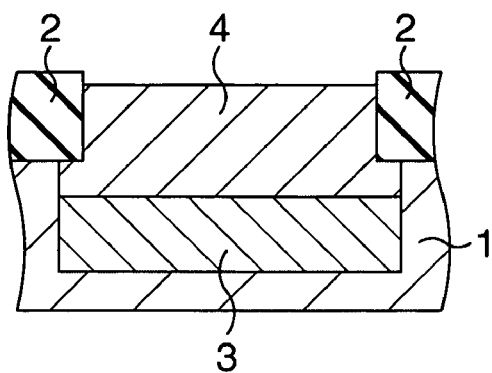
Figure 15B:
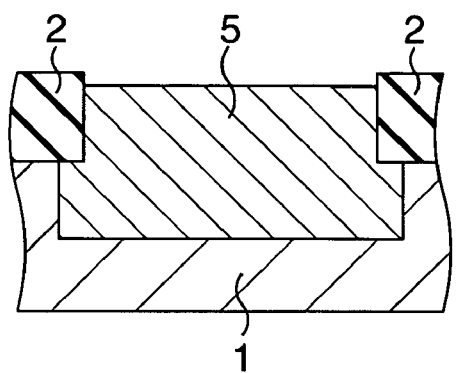
Figure 15C:
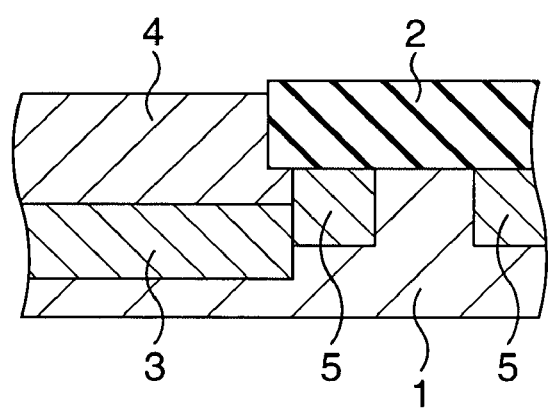

Next, as shown in FIG. 15A to FIG. 15C, n-wells 5 are formed in the pMOS region and peripheral of the cell and nMOS regions (not shown in FIG. 15A). At forming the n-wells 5, phosphorus ions, for example, are ion-implanted under a condition of an energy of 500 keV to 700 keV and a dose amount of $1\times10^{13}$ cm$^{-2}$ to $3\times10^{13}$ cm$^{-2}$.

Figure 16A:
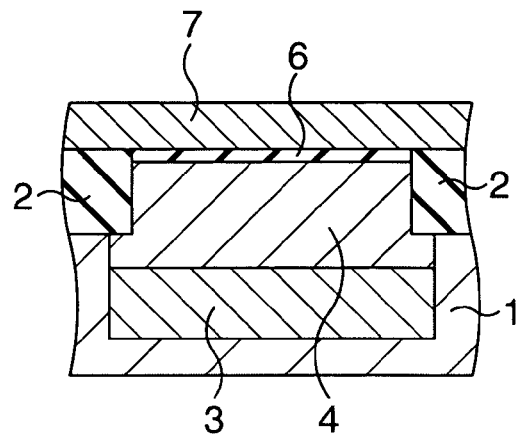
Figure 16B:
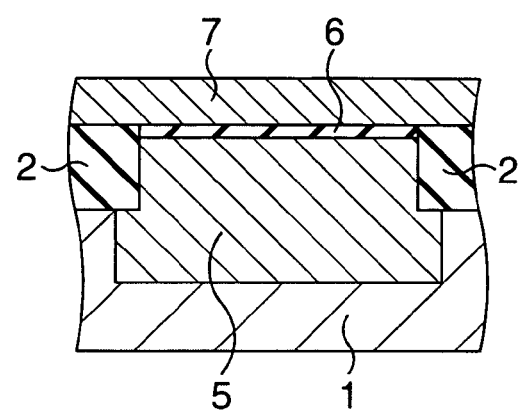
Figure 16C:
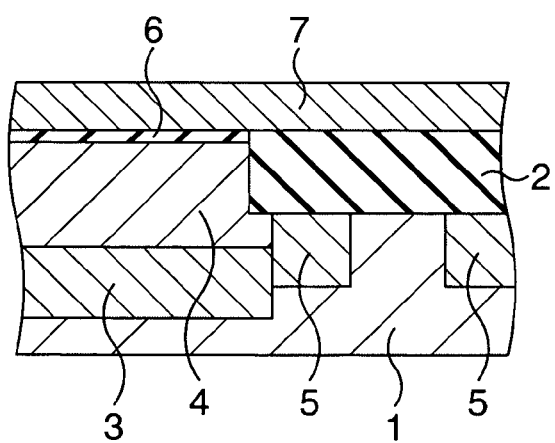

Thereafter, as shown in FIG. 16A to FIG. 16C, in the nMOS region, PMOS region, and the cell region, a tunnel oxide film 6 of approximately 9.5 nm to 11 nm thick is formed by dray oxidation of 1000° C. to 1100° C. Subsequently, an amorphous silicon ($\alpha$-Si) film 7 doped with phosphorus is formed to be approximately 80 nm to 100 nm thick on an entire surface by a CVD (Chemical Vapor Deposition) method. A doped amount of phosphorus in the $\alpha$-Si film 7 is, for example, approximately $4\times10^{19}$ cm$^{-3}$ to $6\times10^{19}$ cm$^{-3}$. Incidentally, the tunnel oxide film 6 can be formed by wet oxidation at a temperature of, for example, approximately 750° C. to 900° C.

Figure 17A:
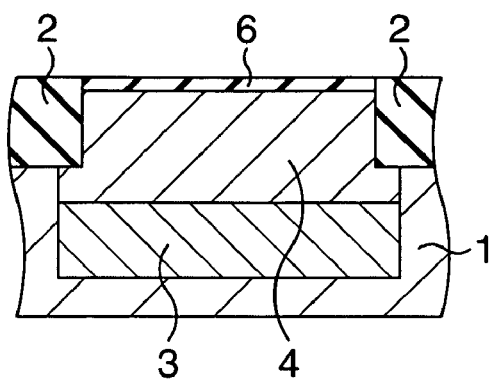
Figure 17B:
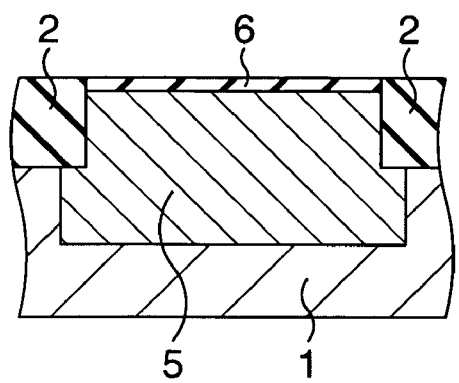
Figure 17C:
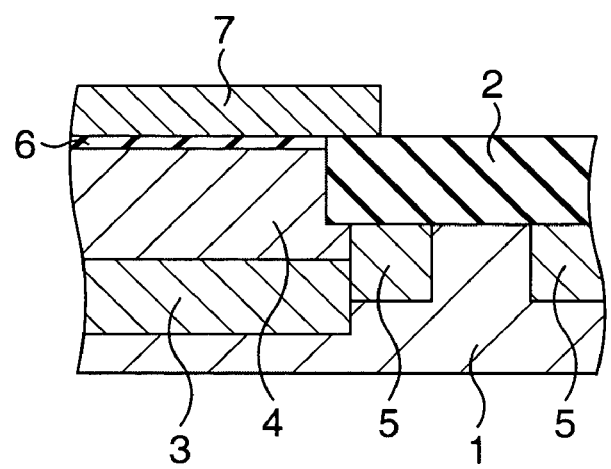

Next, as shown in FIG. 17A to FIG. 17C, by photolithography technology and etching technology, the $\alpha$-Si film 7 is patterned so that the $\alpha$-Si film remains only in the cell region. More specifically, the $\alpha$-Si film 7 in the logic circuit region 203 is removed.

Figure 18A:
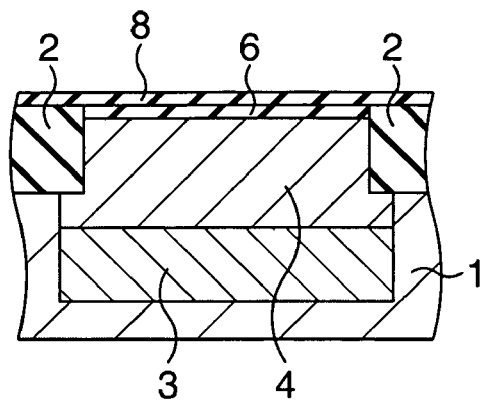
Figure 18B:
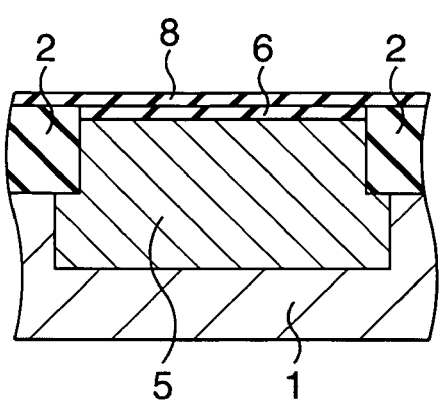
Figure 18C:
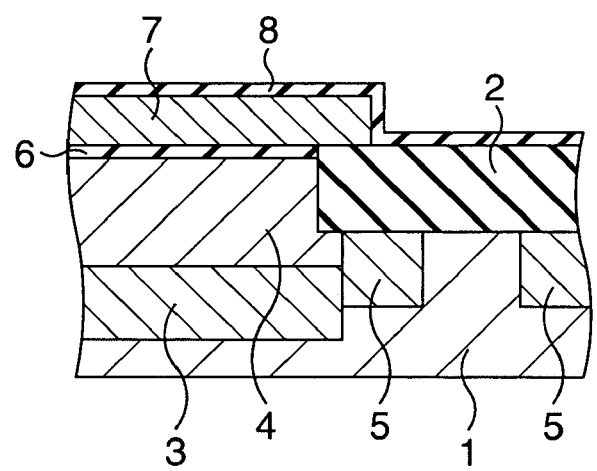

Next, as shown in FIG. 18A to FIG. 18C, an ONO film 8 is formed on the entire surface. At forming the ONO film 8, for example, a Si oxide film of approximately 4 nm to 7 nm thick is formed by a CVD method and a Si nitride film of approximately 7 nm to 9 nm thick is formed by a CVD method. Thereafter, a Si oxide film of approximately 4 nm to 6 nm thick is formed by thermal oxidation at a temperature of approximately 900° C. to 1100° C.

Figure 19A:
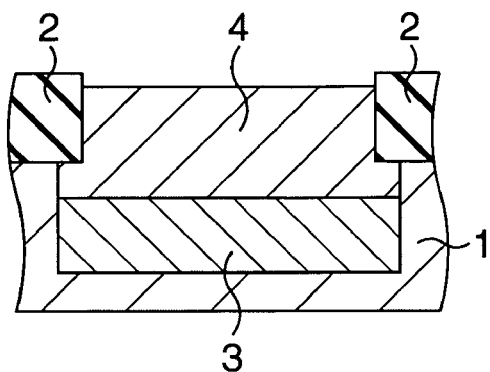
Figure 19B:
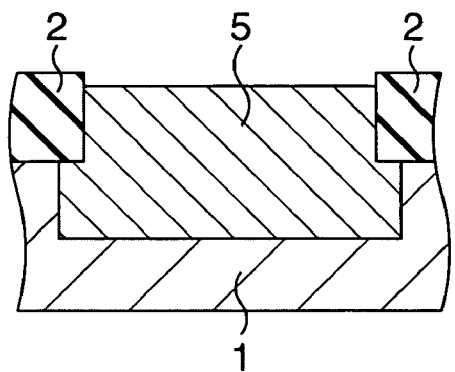
Figure 19C:
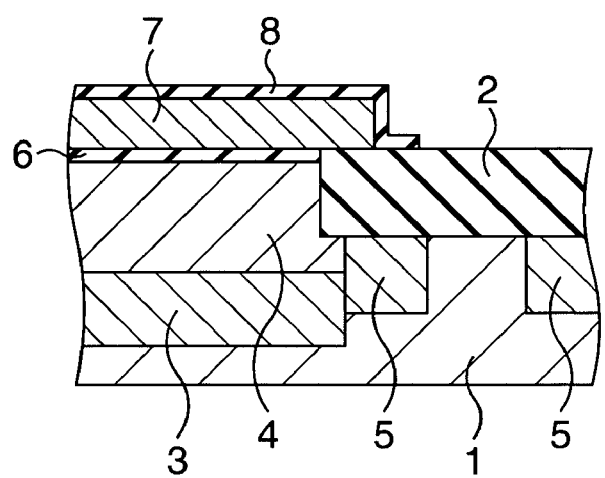

Thereafter, as shown in FIG. 19A to FIG. 19C, the ONO film 8 is patterned by photolithography technology and etching technology so that the ONO film 8 remains only in the cell region. More specifically, the ONO film 8 in the logic circuit region 203 is removed.

Figure 20A:
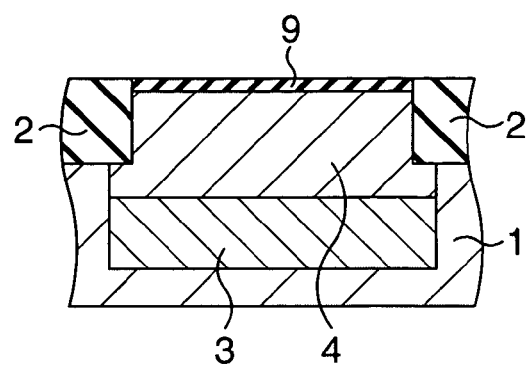
Figure 20B:
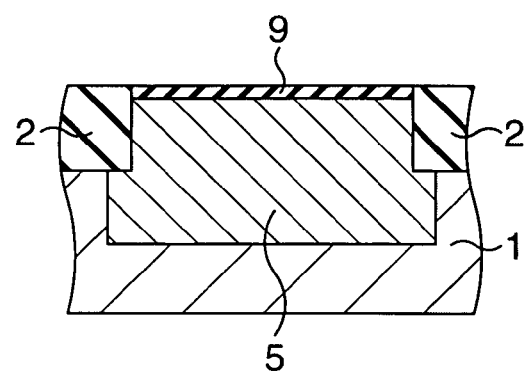
Figure 20C:
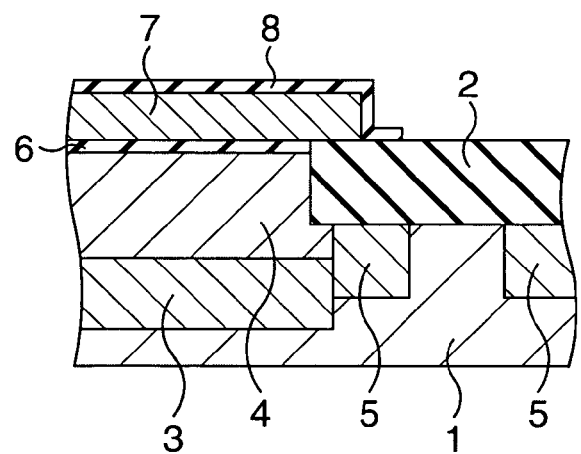
Figure 21A:
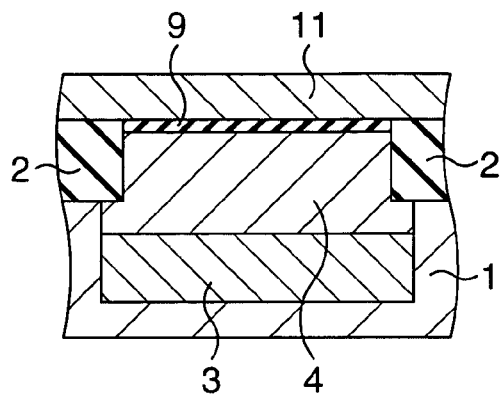
Figure 21B:
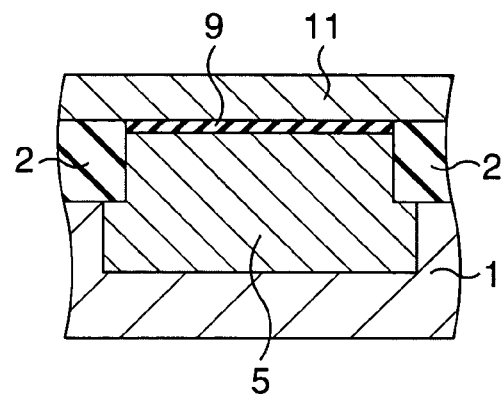
Figure 21C:
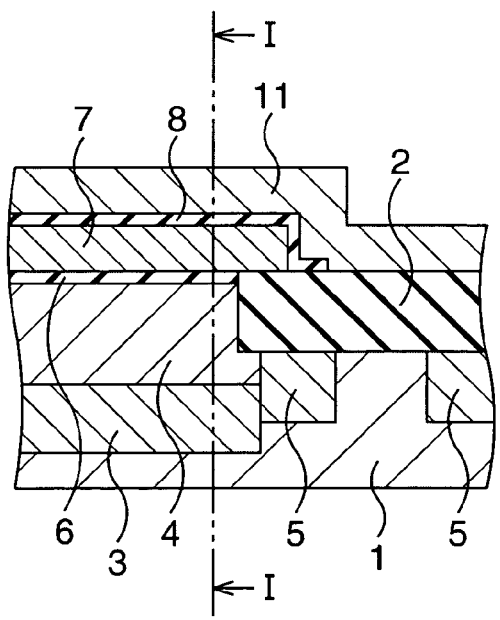
Figure 21D:
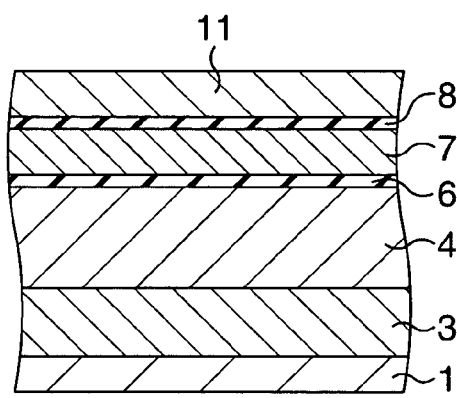
Figure 22A:
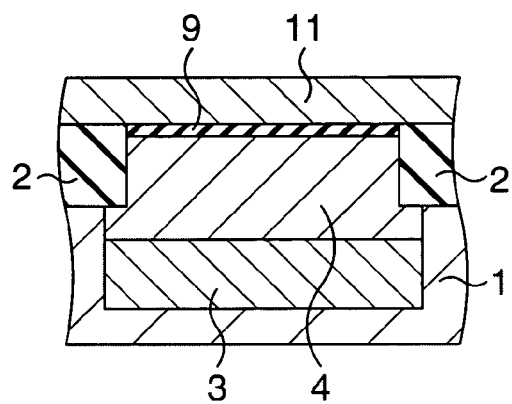
Figure 22B:
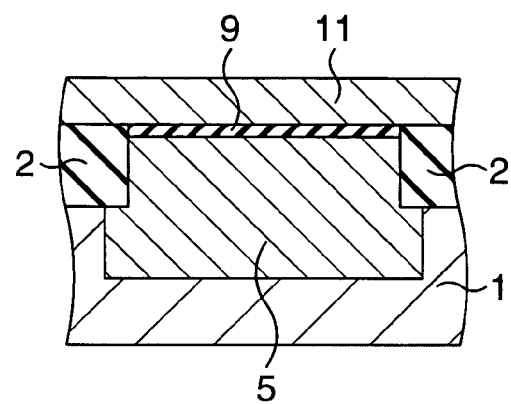
Figure 22C:
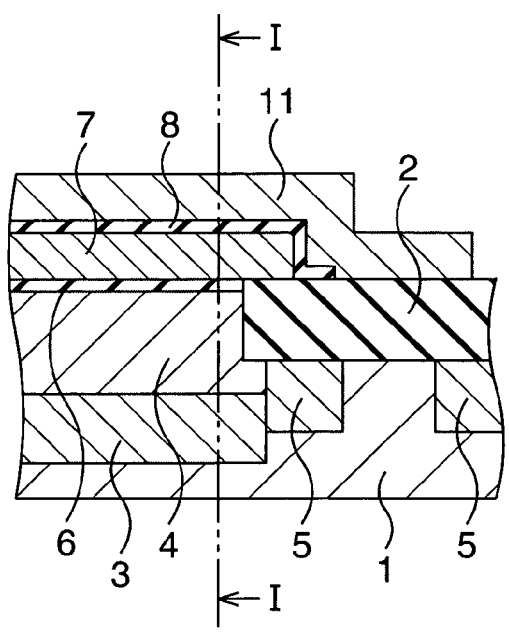
Figure 22D:
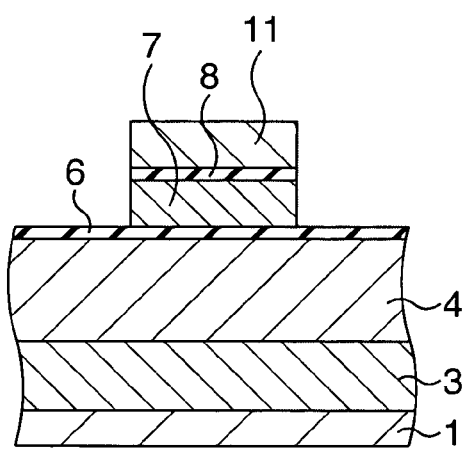
Figure 23A:
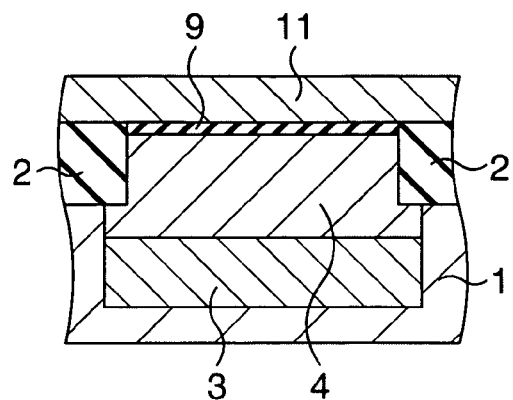
Figure 23B:
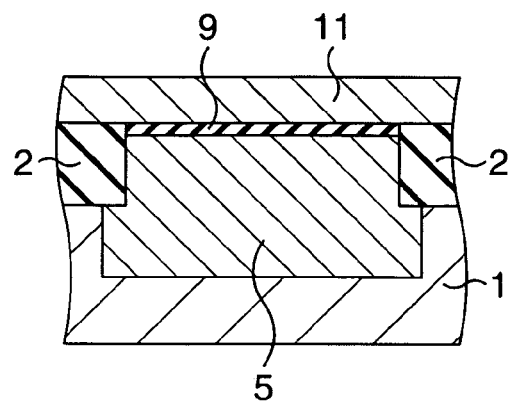
Figure 23C:
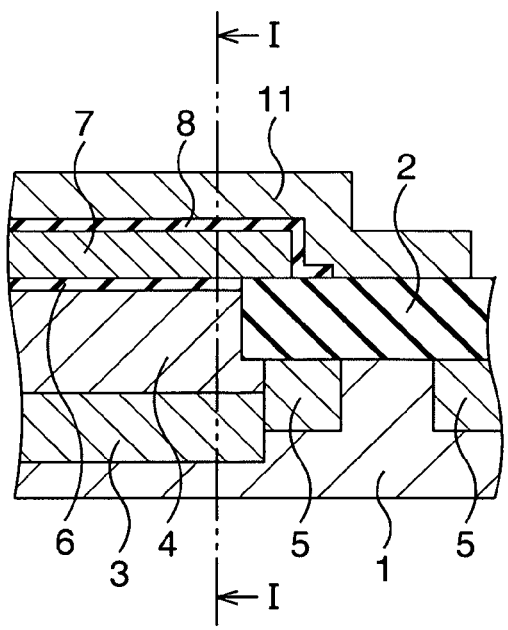
Figure 23D:
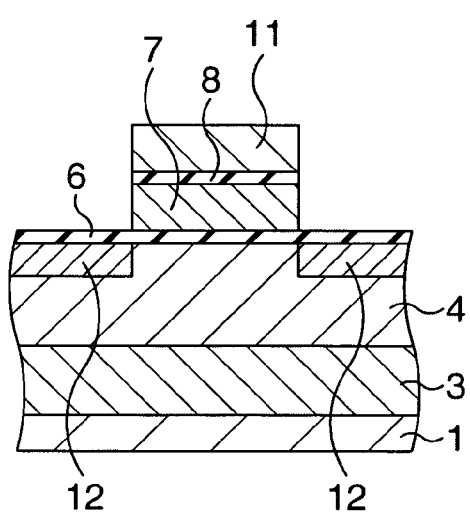
Figure 24A:
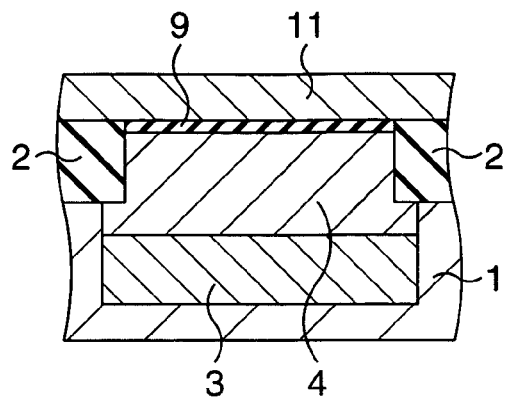
Figure 24B:
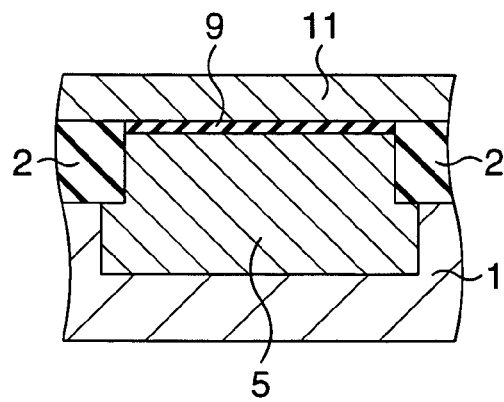
Figure 24C:
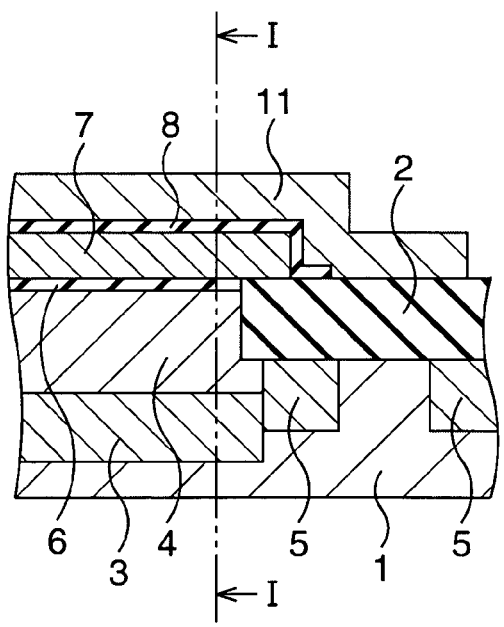
Figure 24D:
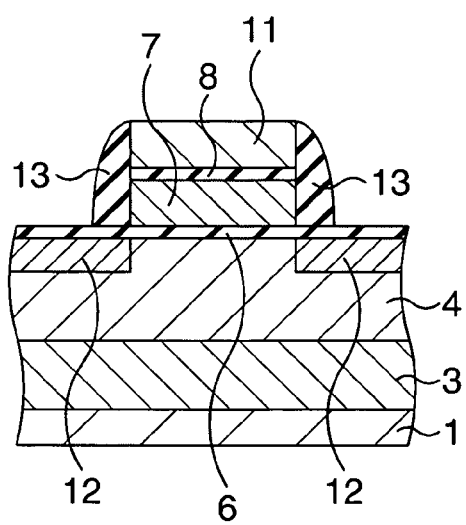
Figure 25A:
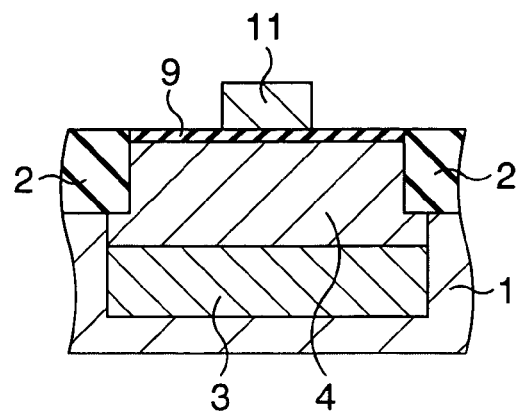
Figure 25B:
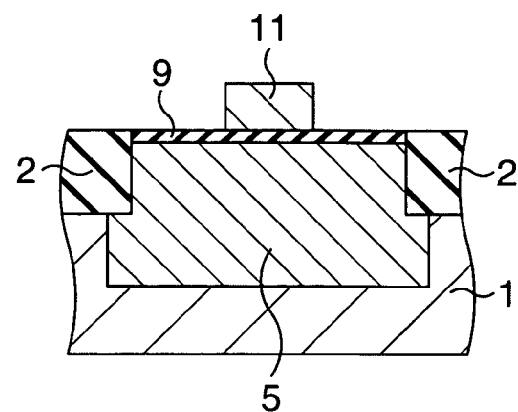
Figure 25C:
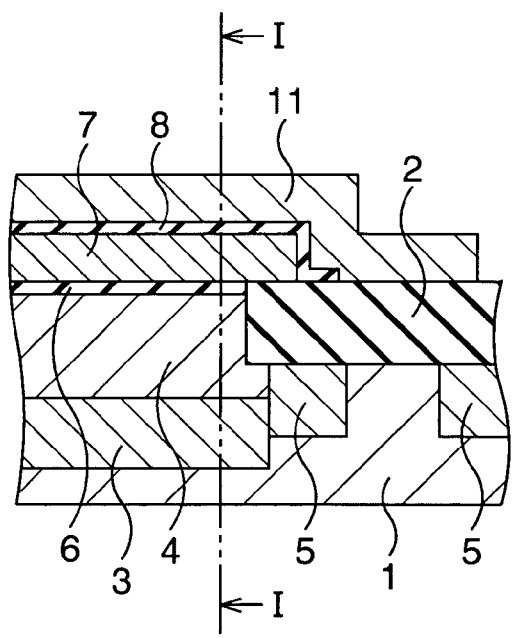
Figure 25D:
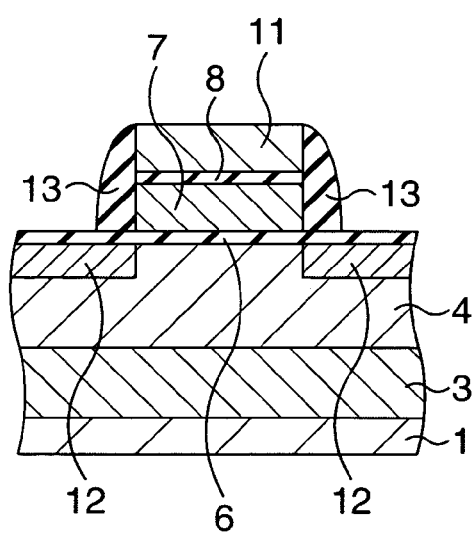
Figure 26A:
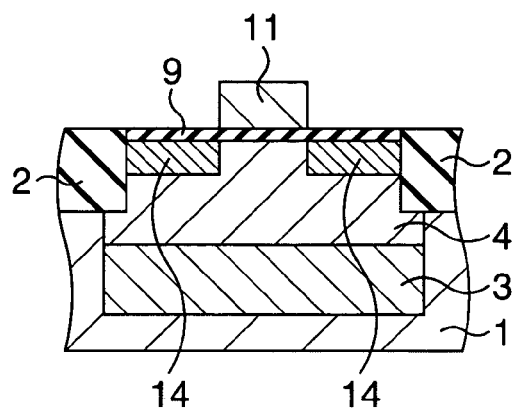
Figure 26B:
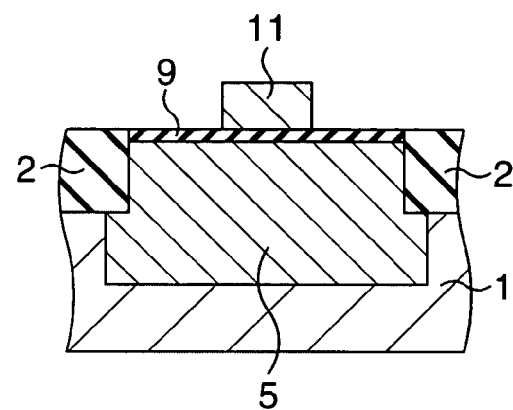
Figure 26C:
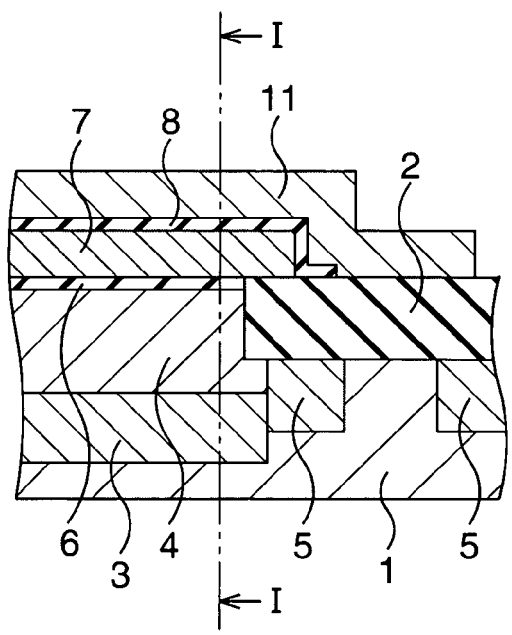
Figure 26D:
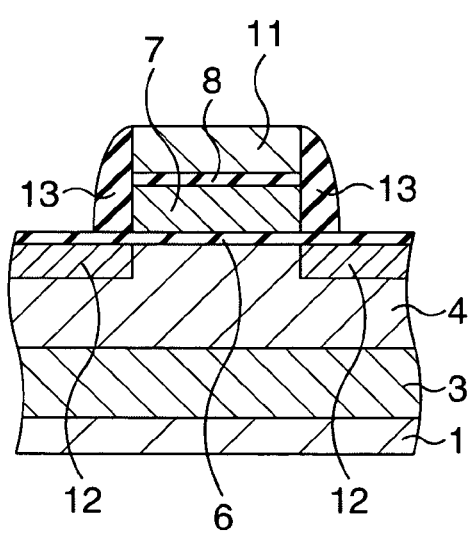
Figure 27A:
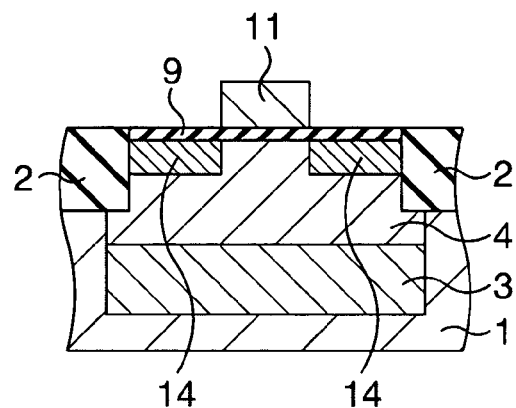
Figure 27B:
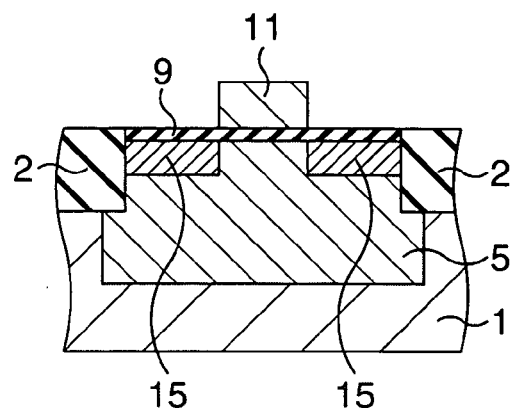
Figure 27C:
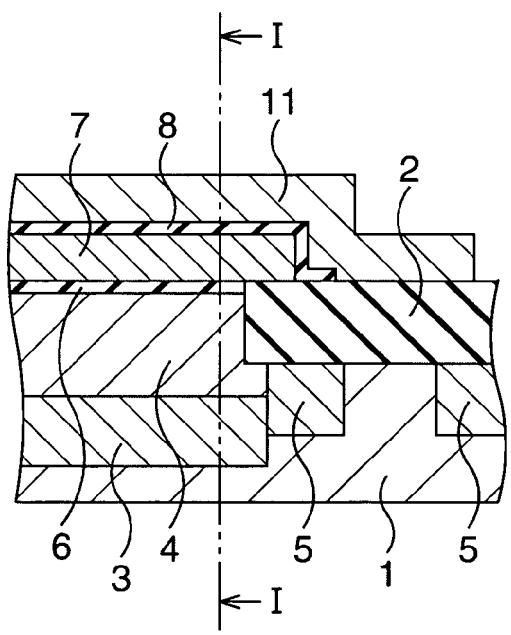
Figure 27D:
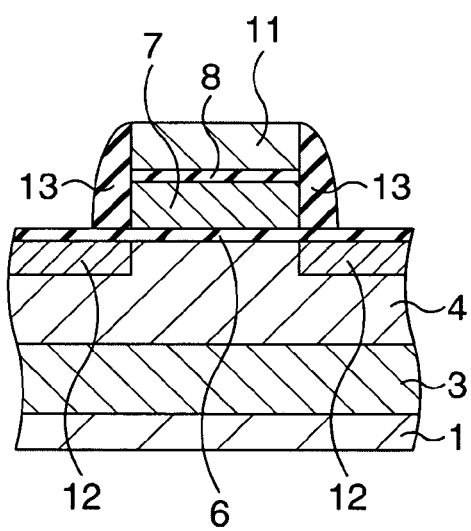
Figure 28A:
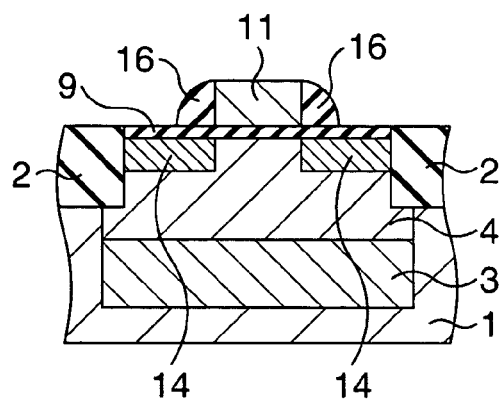
Figure 28B:
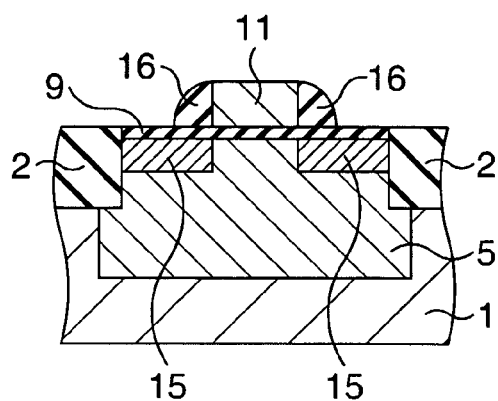
Figure 28C:
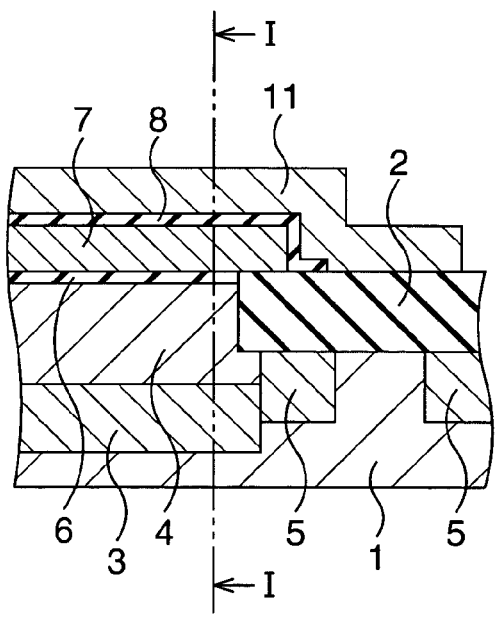
Figure 28D:
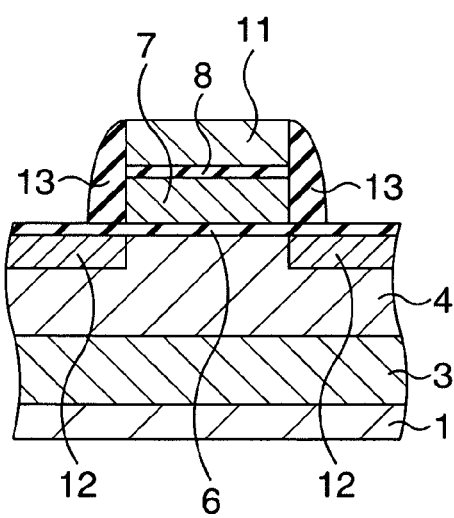
Figure 29A:
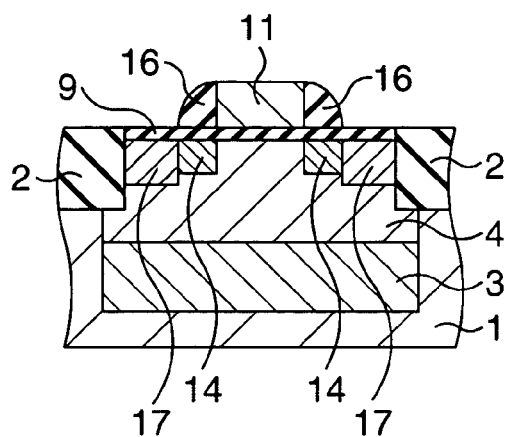
Figure 29B:
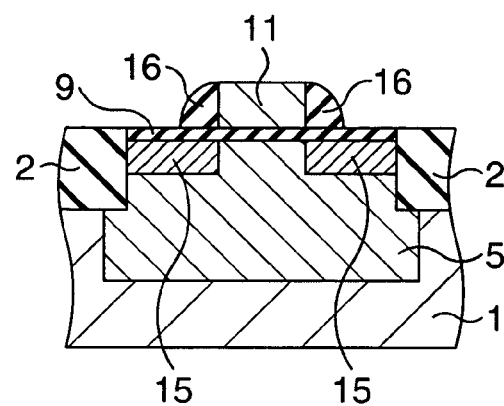
Figure 29C:
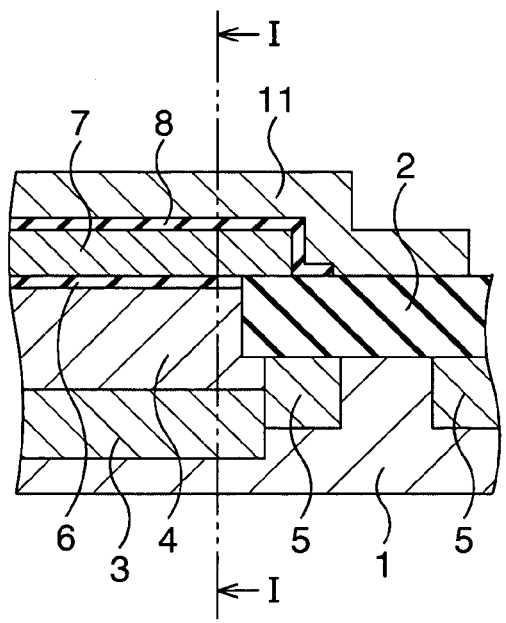
Figure 29D:
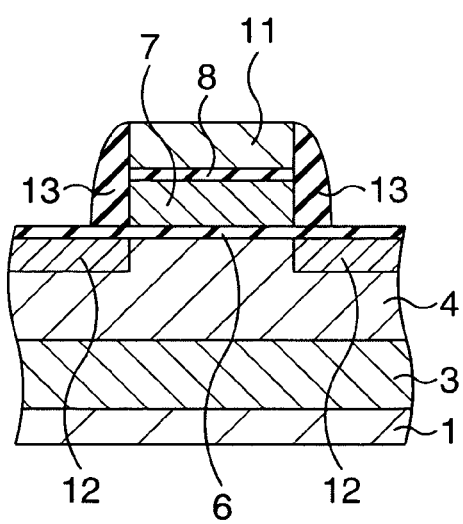
Figure 30A:
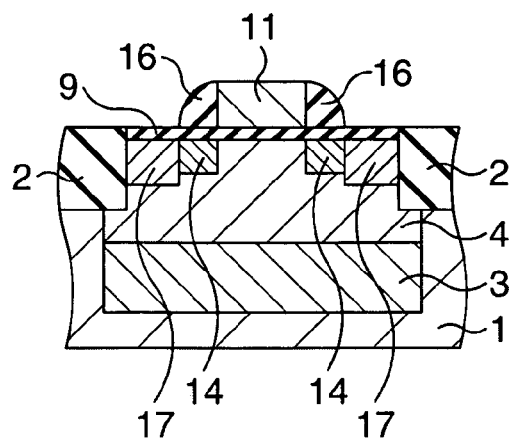
Figure 30B:
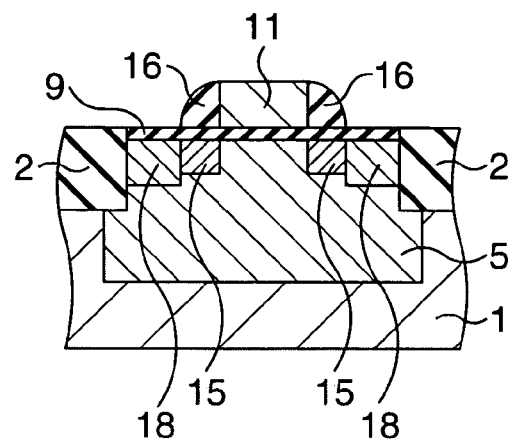
Figure 30C:
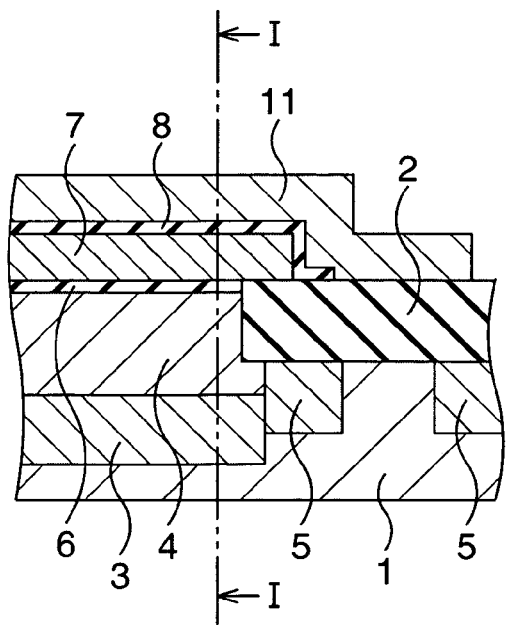
Figure 30D:
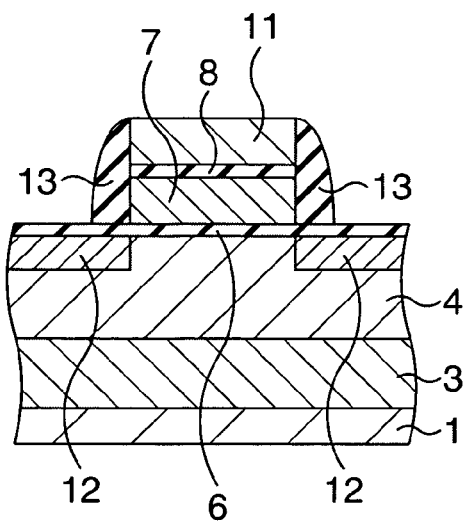
Figure 31A:
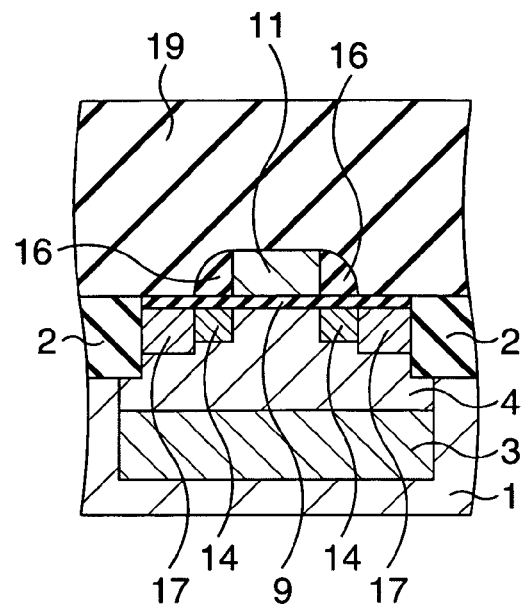
Figure 31B:
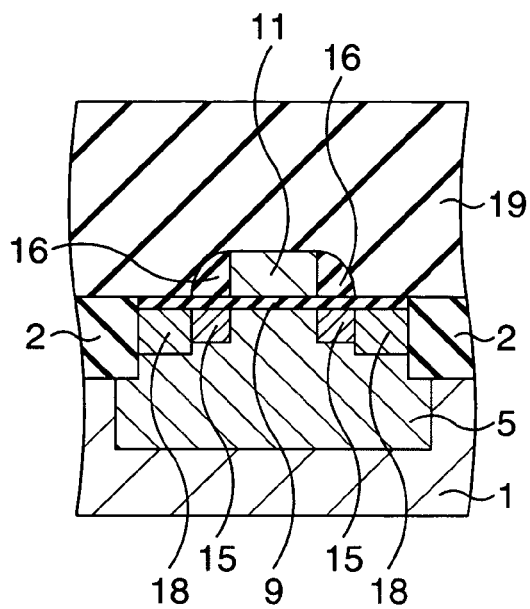
Figure 31C:
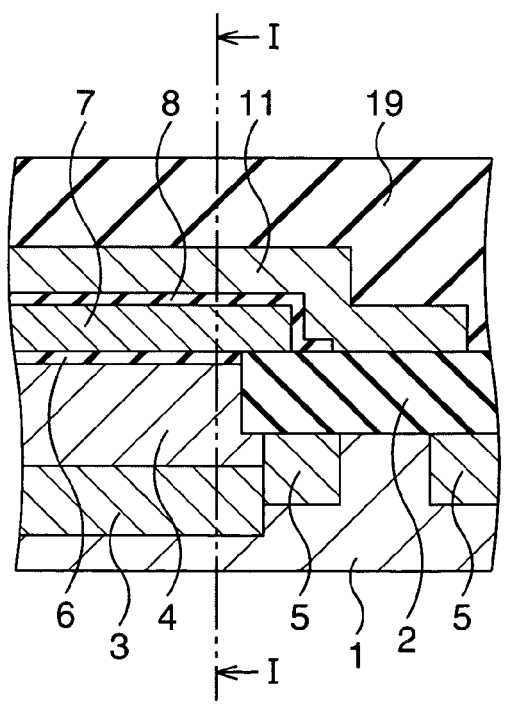
Figure 31D:
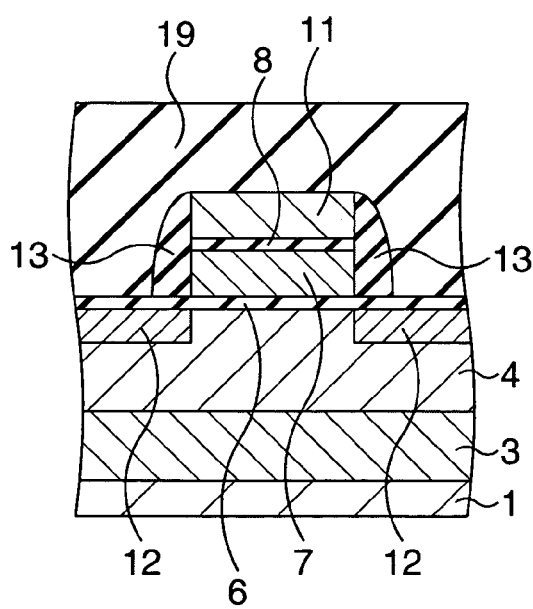
Figure 32A:
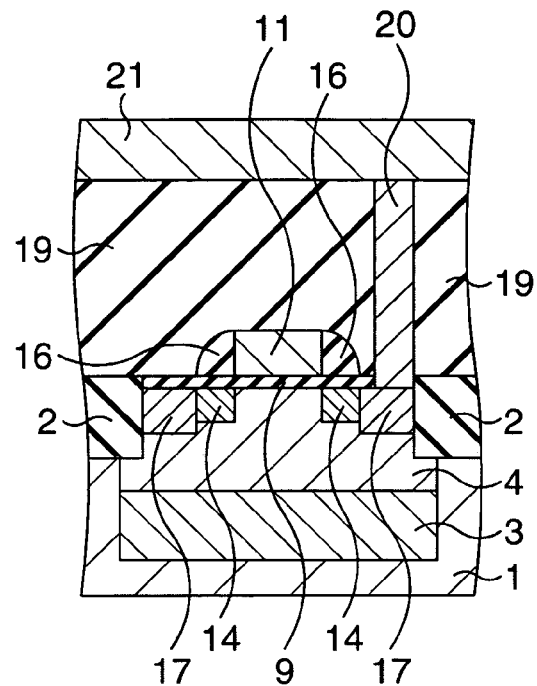
Figure 32B:
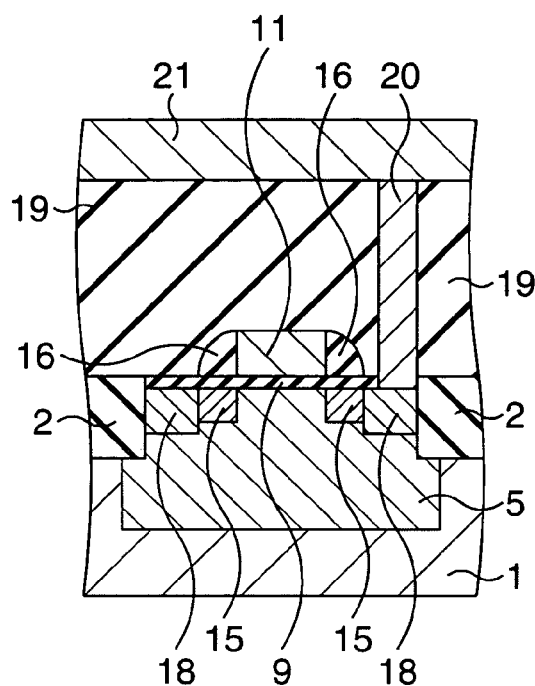
Figure 32C:
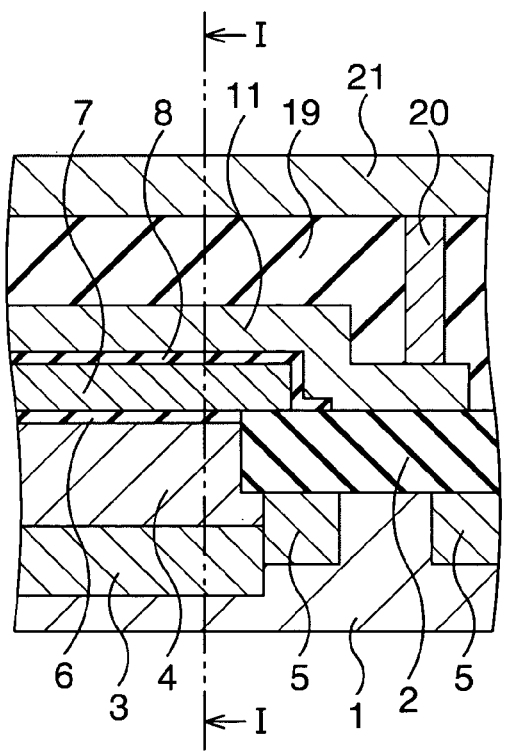
Figure 32D:
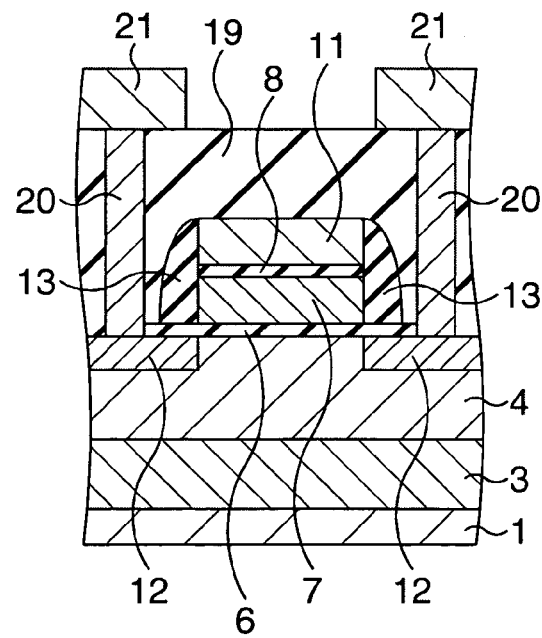

Subsequently, as shown in FIG. 20A to FIG. 20C, in the nMOS region and the pMOS region, a gate oxide film 9 of approximately 14 nm to 16 nm thick is formed by wet oxidation at a temperature of 750° C. to 900° C. In the present embodiment, as both the nMOS transistors 101n and the pMOS transistors 101p, transistors which operate at high voltage are formed. If transistors which operate at low voltage and/or transistors which operate at medium voltage are also mounted, removal of thick gate oxide films with photolithographic masking method and thermal oxidation are conducted an appropriate number of times, for example.

Next, as shown in FIG. 21A to FIG. 21D, a poly-Si film 11 undoped with impurity is formed to be approximately 150 nm to 200 nm thick on the entire surface by a CVD method.

Next, as shown in FIG. 22A to FIG. 22D, by photolithography technology and etching technology, the poly-Si film 11, the ONO film 8, and the α-Si film 7 in the cell region are patterned to a planar shape of a gate.

Subsequently, as shown in FIG. 23A to FIG. 23D, in the cell region, n+ diffusion layers 12 are formed as a source and a drain. At forming the n+ diffusion layers 12, for example, arsenic ions are ion-implanted under a condition of an energy of 30 keV to 60 keV and a dose amount of $6 \times 10^{14}$ cm$^{-2}$ to $1.5 \times 10^{15}$ cm$^{-2}$ with a mask of the poly-Si film 11.

Subsequently, as shown in FIG. 24A to FIG. 24D, on sides of the gate formed in the cell region, spacers 13 are formed. At forming the spacers 13, after a Si nitride film of approximately 100 nm to 120 nm thick, for example, is formed, anisotropic etching thereof is performed.

Next, as shown in FIG. 25A to FIG. 25D, by photolithography technology and etching technology, the poly-Si film 11 in the nMOS region and the pMOS region is patterned to planar shapes of gates.

Next, as shown in FIG. 26A to FIG. 26D, n$^-$ diffusion layers 14 are formed in the nMOS region. At forming the n$^-$ diffusion layers 14, arsenic ions, for example, are ion-implanted under a condition of an energy of 100 keV to 120 keV, a dose amount of $2 \times 10^{13}$ cm$^{-2}$ to $3 \times 10^{13}$ cm$^{-2}$ and tilted angle of 28 degree with the gate poly-Si film 11 and photo resist as a mask. Incidentally, when the transistors which operate at low voltage and/or the transistors which operate at medium voltage are formed, an ion species, the energy, and the dose amount are appropriately adjusted.

Thereafter, as shown in FIG. 27A to FIG. 27D, p$^-$ diffusion layers 15 are formed in the pMOS region. At forming the p$^-$ diffusion layers 15, BF2 ions, for example, are ion-implanted under a condition of an energy of 100 keV to 120 keV, a dose amount of $2 \times 10^{13}$ cm$^{-2}$ to $3 \times 10^{13}$ cm$^{-2}$ and tilted angle of 28 degree with the gate poly-Si film 11 and photo resist as a mask. Incidentally, when the transistors which operate at low voltage and/or the transistors which operate at medium voltage are formed, the ion species, the energy, and the dose amount are appropriately adjusted.

Subsequently, as shown in FIG. 28A to FIG. 28D, on sides of the gates formed in the nMOS region and the pMOS region spacers 16 are formed. At forming the spacers 16, after a Si oxide film of, for example, approximately 100 nm to 120 nm thick is formed, anisotropic etching thereof is performed. Incidentally, as the spacers 16 are formed, the Si oxide films are formed on sides of the spacers 13 formed in flash cell area and in practice the spacers 13 become thicker.

Next, as shown in FIG. 29A to FIG. 29D, n$^+$ diffusion layers 17 are formed in the nMOS region. At forming the n$^+$ diffusion layers 17, phosphorus ions, for example, are ion-implanted under a condition of an energy of 10 keV to 20 keV and a dose amount of $5 \times 10^{15}$ cm$^{-2}$ to $8 \times 10^{15}$ cm$^{-2}$ with a mask of the poly-Si film 11 and the spacers 16 and photo resist. The n$^-$ diffusion layers 14 and the n$^+$ diffusion layers 17 constitute a source 104s and a drain 104d of an LDD structure.

Next, as shown in FIG. 30A to FIG. 30D, p$^+$ diffusion layers 18 are formed in the pMOS region. At forming the p$^+$ diffusion layers 18, for example, boron ions are ion-implanted under a condition of an energy of 3 keV to 5 keV and a dose amount of $3 \times 10^{15}$ cm$^2$ to $5 \times 10^{15}$ cm$^{-2}$ with a mask of the poly-Si film 11 and the spacers 16 and photo resist. The p$^-$ diffusion layers 15 and the p$^+$ diffusion layers 18 constitute a source 106s and a drain 106d of the LDD structure. Thereafter, silicide films (not shown) are formed on surfaces of the source, the drain, and the gate. At forming the silicide films, for example, Co films are formed and then annealed to form CoSi only on top of Si or poly Si and then Co on insulating layers are removed.

Subsequently, as shown in FIG. 31A to FIG. 31D, an interlayer insulation film 19 is formed on an entire surface. Then, planarization thereof is conducted by CMP. As the interlayer insulation film 19, for example, an HDP film or the like are formed.

Next, as shown in FIG. 32A to FIG. 32D, by photolithography technology and etching technology, plural contact holes are formed to reach, respectively, the poly-Si film 7 (control gate CG in FIG. 12) and the n$^+$ diffusion layers 12 in the cell region, the n$^+$ diffusion layers 17 for the drain or the source in the nMOS region, and the p$^+$ diffusion layers 18 for the drain or the source in the pMOS region. Then, by embedding W (tungsten) and the like therein, contact plugs 20 are formed. Next, wirings 21 of a first layer (metal wirings M1 in FIG. 12) are formed. At this time, in the present embodiment, the wirings 21 electrically connect the poly-Si film 7 (control gate CG) in the cell region to both the n$^+$ diffusion layers 17 and the p$^+$ diffusion layers 18 for the drains or the sources.

Thereafter, by further forming an interlayer insulation film, wirings and the like of an upper layer, a semiconductor device mounting the logic circuit and the flash memory is completed. For example, as the upper wirings, plural Cu wirings are formed. At forming multilayer wirings, it is preferable that as an interlayer insulation film a low dielectric constant film is formed and plasma processing is performed. It is also preferable that a Si nitride film is formed as a diffusion prevention film for Cu (copper).

According to the above method, even if the wiring pitch in the flash memory region 202 is set to be wide, an occupied area of the flash memory region 202 being relatively small, an increase in an entire area of the die 201 is extremely small. Therefore, by setting the wider wiring pitch while restraining the increase in the entire area of the die 201, only the wirings 21 of one layer is required as a wiring layer for electrically connecting the control gates CG (poly-Si films 7) of respective memories to the n$^+$ diffusion layers 17 and the p$^+$ diffusion layers 18. Additionally, the respective MOS transistors having these diffusion layers are used not only as the protective diodes but also as a part of a decoder. Therefore, a design and a manufacturing process thereof become simple.

Figure 33:
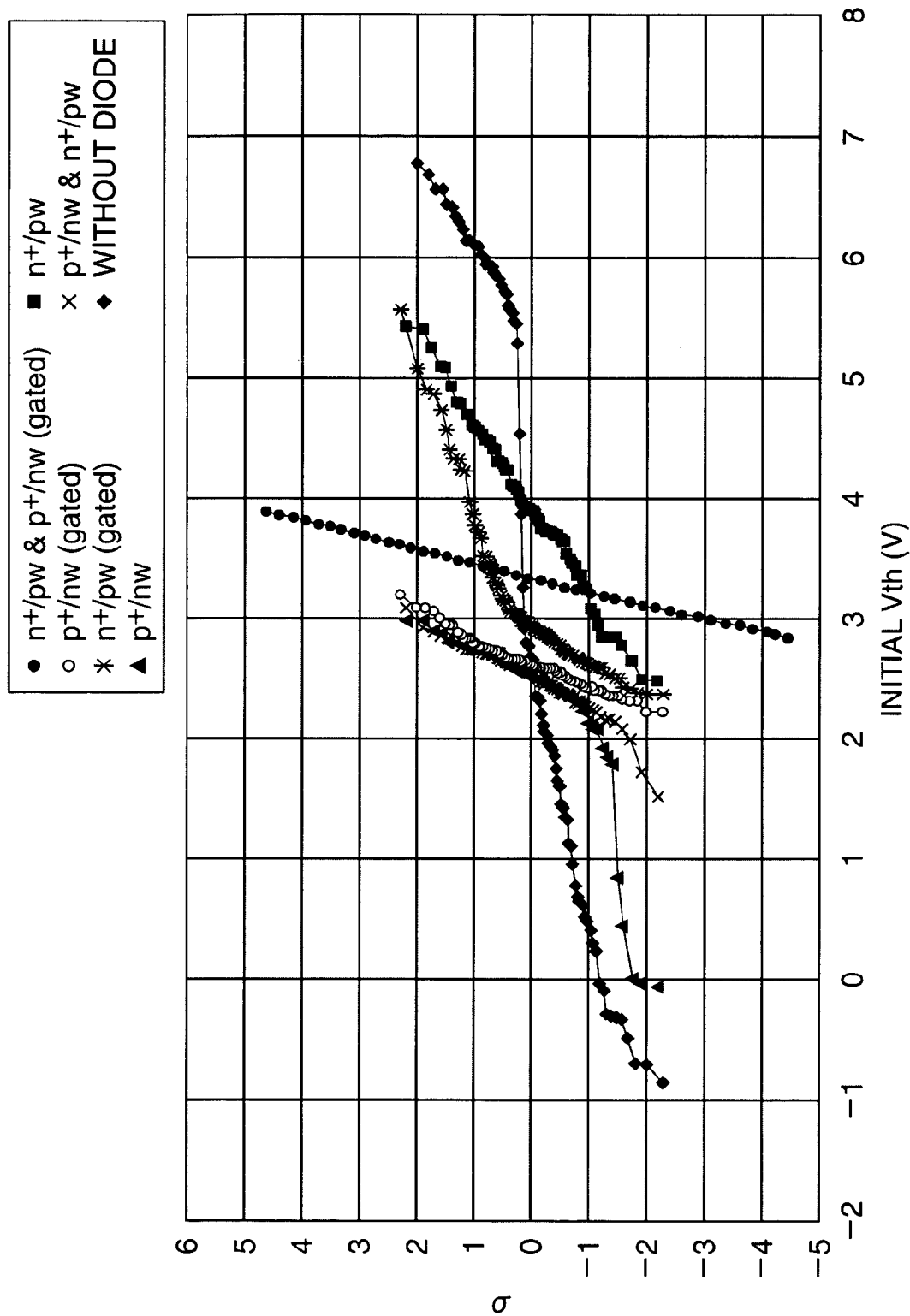
FIG. 33 is a graph showing variation of initial threshold voltage (Vth)

Moreover, since the control gate CG is connected to the n$^+$ diffusion layer 17 and the p$^+$ diffusion layer 18 which respectively constitute the drains of the nMOS transistor and the pMOS transistor, the threshold voltage variation is small. In practice the inventors of the present invention conducted measuring of initial threshold voltage (Vth) after manufacturing in various protective diodes, and obtained results shown in FIG. 33. In FIG. 33, an "n$^+$/pw&p$^+$/nw (gated)"

indicates the result of the semiconductor device manufactured according to the embodiment of the present invention.

Figure 39:
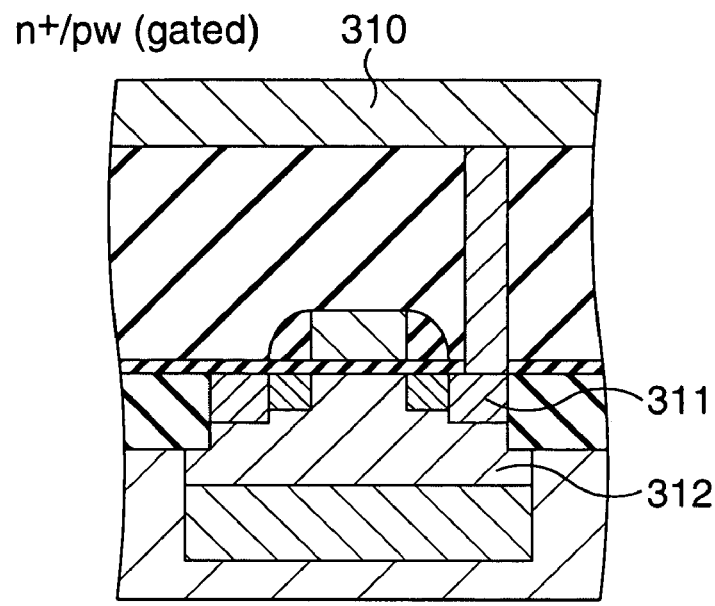
FIG. 39 is a sectional view showing an example of a conventional protective diode.
Figure 40:
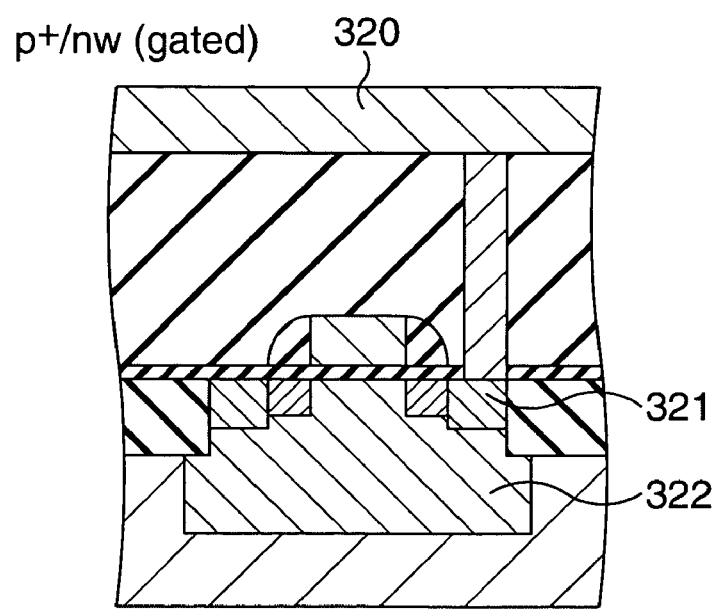
FIG. 40 is a sectional view showing another example of a conventional protective diode.
Figure 41:
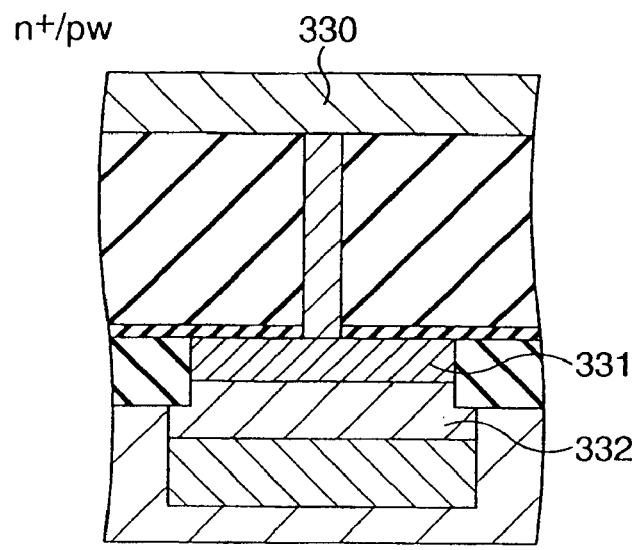
FIG. 41 is a sectional view showing still another example of a conventional protective diode.
Figure 42:
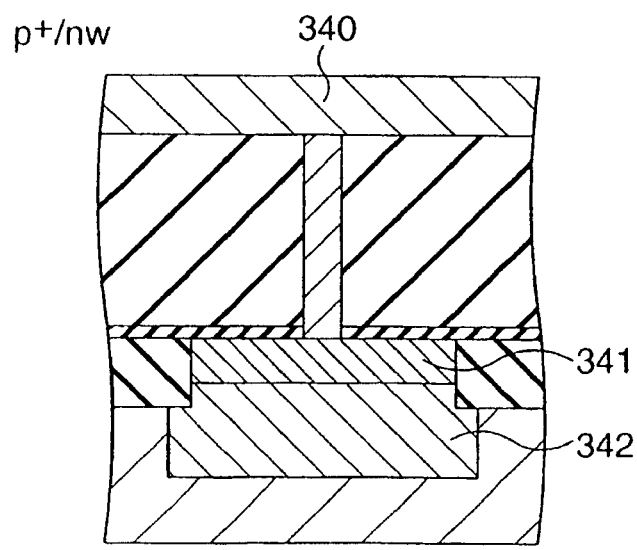
FIG. 42 is a sectional view showing yet another example of a conventional protective diode.
Figure 43:
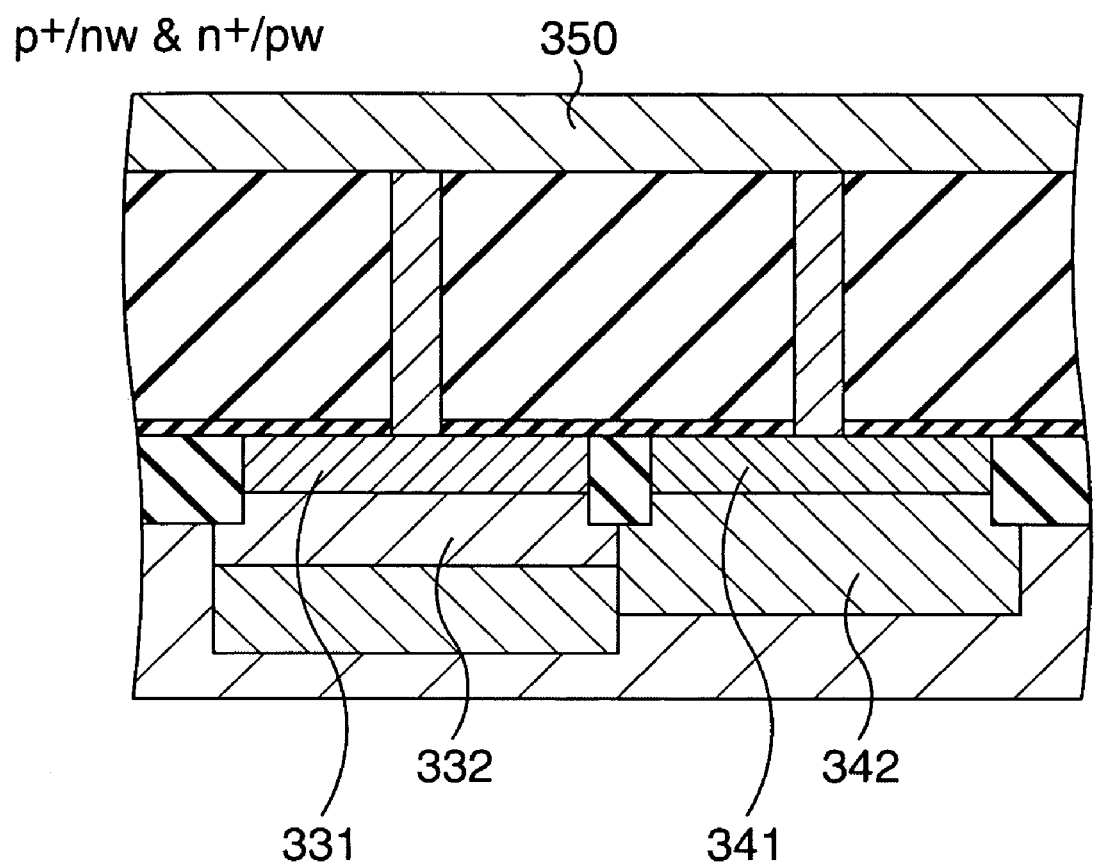
FIG. 43 is a sectional view showing still yet another example of a conventional protective diode.

A "p+/nw (gated)" indicates the result of a conventional protective diode shown in FIG. 40 (a control gate is connected via a wiring 320 to a p+ diffusion layer 321 on an n-well 322 of a pMOS transistor). An "n+/pw (gated)" indicates the result of a conventional protective diode shown in FIG. 39 (a control gate is connected via a wiring 310 to an n+ diffusion layer 311 on a p-well 312 of an nMOS transistor). A "p+/nw" indicates the result of a protective diode shown in FIG. 42 (a control gate is connected via a wiring 340 to a p+ diffusion layer 341 on an n-well 342 of a diode). An "n+/pw" indicates the result of a conventional protective diode shown in FIG. 41 (a control gate is connected via a wiring 330 to an n+ diffusion layer 331 on a p-well 332 of a diode). A "p+/nw& n+/pw" indicates the result of a conventional protective diode shown in FIG. 43 (a control gate is connected to an n+ diffusion layer and a p+ diffusion layer of two diodes). A "without diode" indicates the result of a case that a control gate is not connected to a protective diode.

As shown in FIG. 33, in the semiconductor device manufactured according to the embodiment of the present invention, the variation of the initial Vth is the smallest. As a consequence, it can be considered that according to the present embodiment even if the electric charge is generated in the control gate during manufacturing of the flash memory, the electric charge can be eliminated from the protective diode quite effectively. Therefore, even without the ultraviolet irradiation, no threshold voltage shift during device operation is occurred because of no injected charges into tunnel oxide film nor ONO film.

Incidentally, a layout of the nMOS transistor and the pMOS transistor used as the protective diode is not specifically limited. The layout shown in FIG. 34 or FIG. 35, for example, can be used.

With regard to the two transistors adjacent in the vertical direction against the direction that the control gates CG extend, in the embodiment shown in FIG. 12, the transistors are line symmetrical to each other. In an embodiment shown in FIG. 34, the layout of the transistors is repetitious. In an embodiment shown in FIG. 35, with regard to the disposition of the metal wirings M1, the metal wirings M1 are connected to the sources and the drains which are positioned, with the gates of the four transistors being fiducial, on different sides to each other, between the two pairs adjacent in the direction that the control gates CG extend. The two transistors adjacent in the vertical direction against the direction that the control gates CG extend are repetitious.

Figure 34:
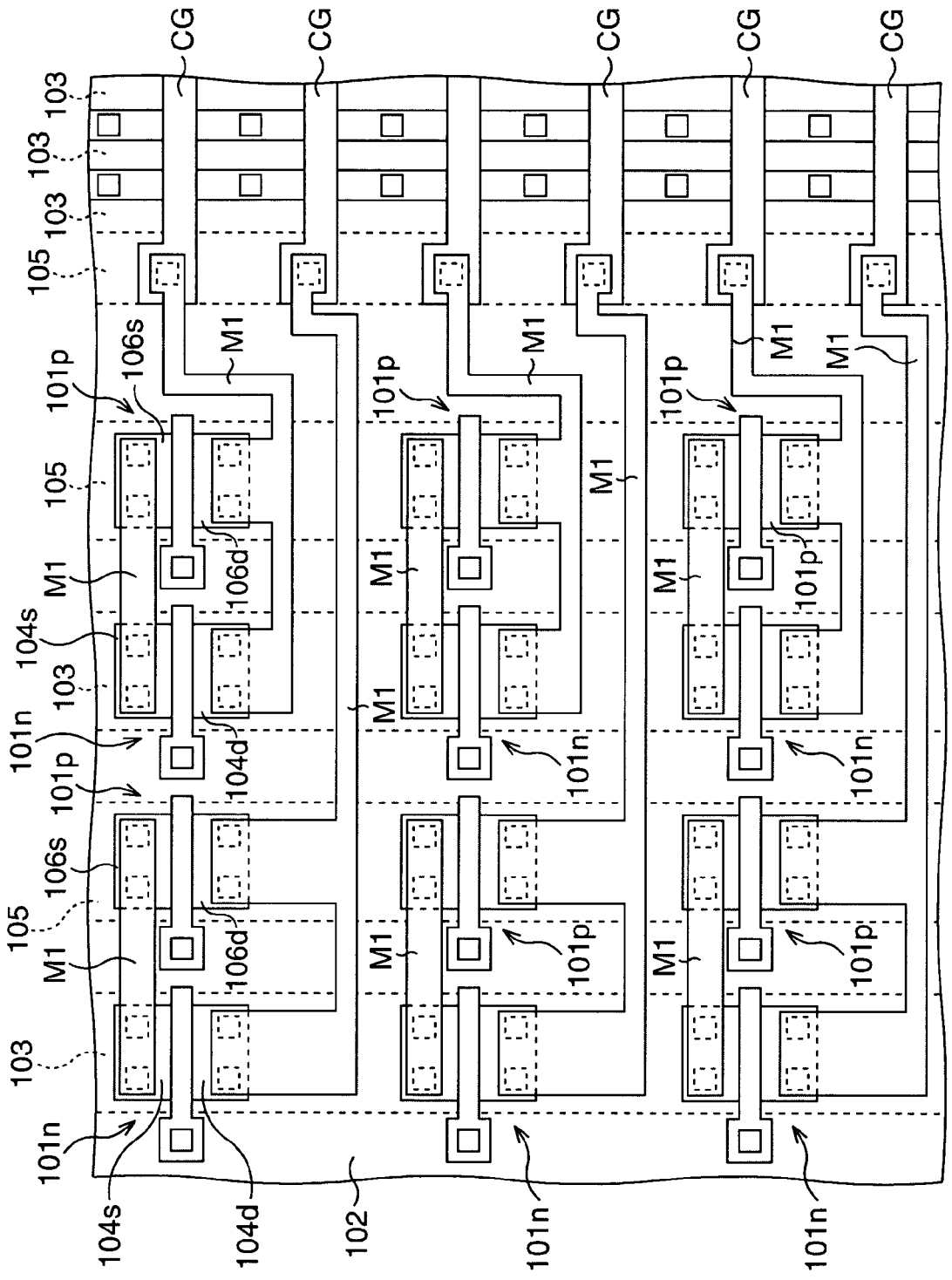
FIG. 34 is a layout view showing an example of a protective diode.
Figure 35:
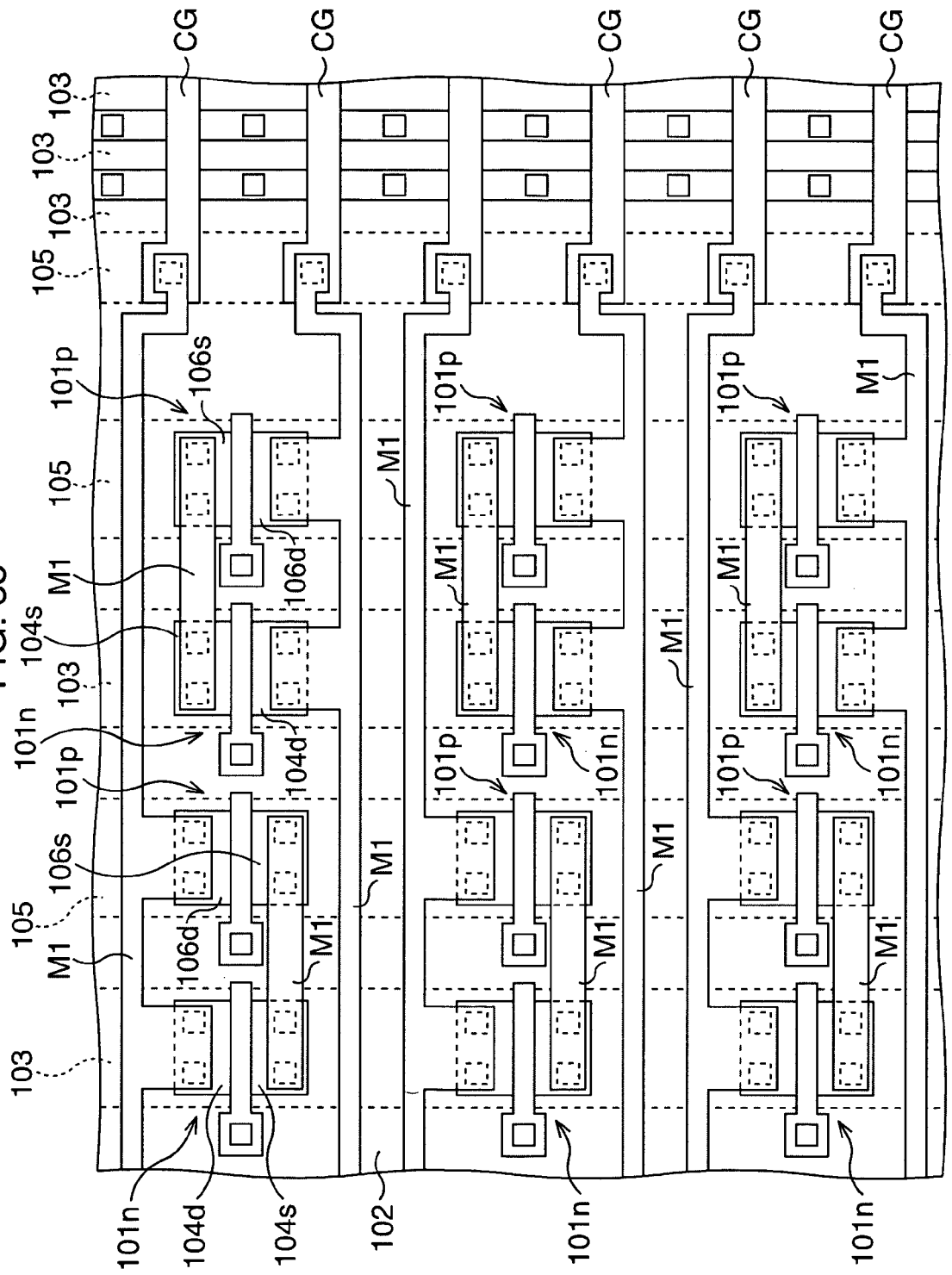
FIG. 35 is a layout view showing another example of a protective diode.
Figure 36A:
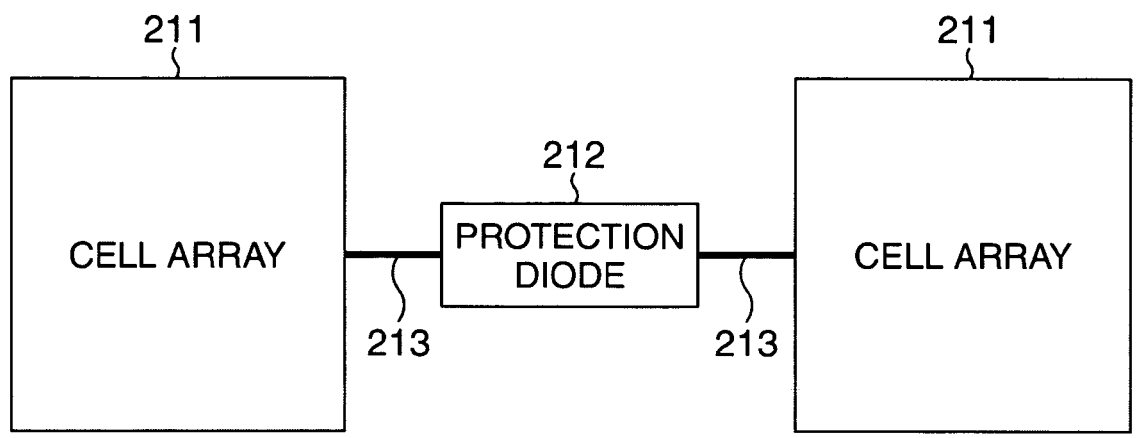
FIG. 36A and FIG. 36B are schematic views showing relationships between cell arrays and protective diodes.
Figure 36B:
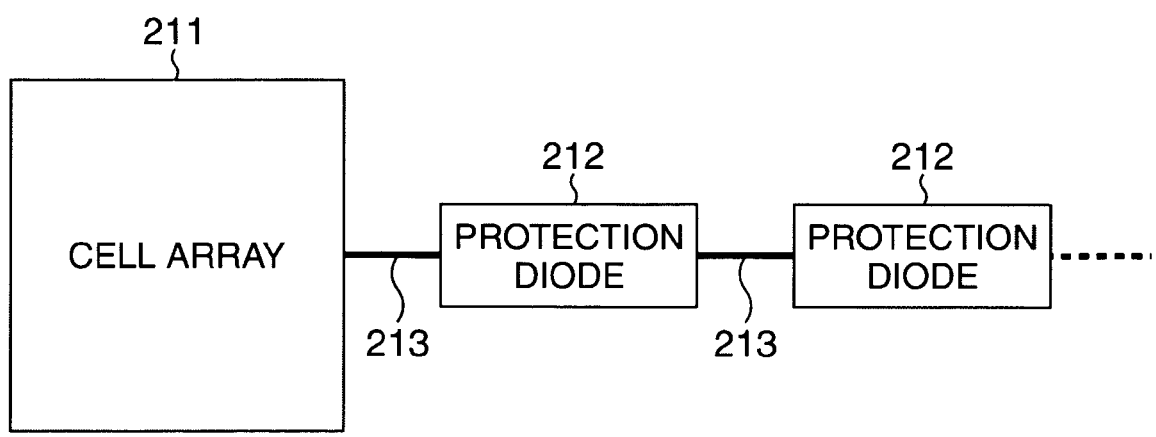

When the layout shown in FIG. 34 or FIG. 35 and the layout shown in FIG. 12 are compared, spaces between element active regions for the nMOS transistor 101n or the pMOS transistor are wider in the layout shown in FIG. 34 or FIG. 35. Therefore, process yield thereof becomes higher. Moreover, when the layout shown in FIG. 35 is adopted, it becomes also possible that a protective diode 212 including a pair of the nMOS transistor and the pMOS transistor is connected via single-layer wirings 213 of the lowest layer to two cell arrays 211 disposed apart from each other, as shown in FIG. 36A. Also, as shown in FIG. 36B, a single cell array 211 can be connected to plural protective diodes 212.

Figure 37:
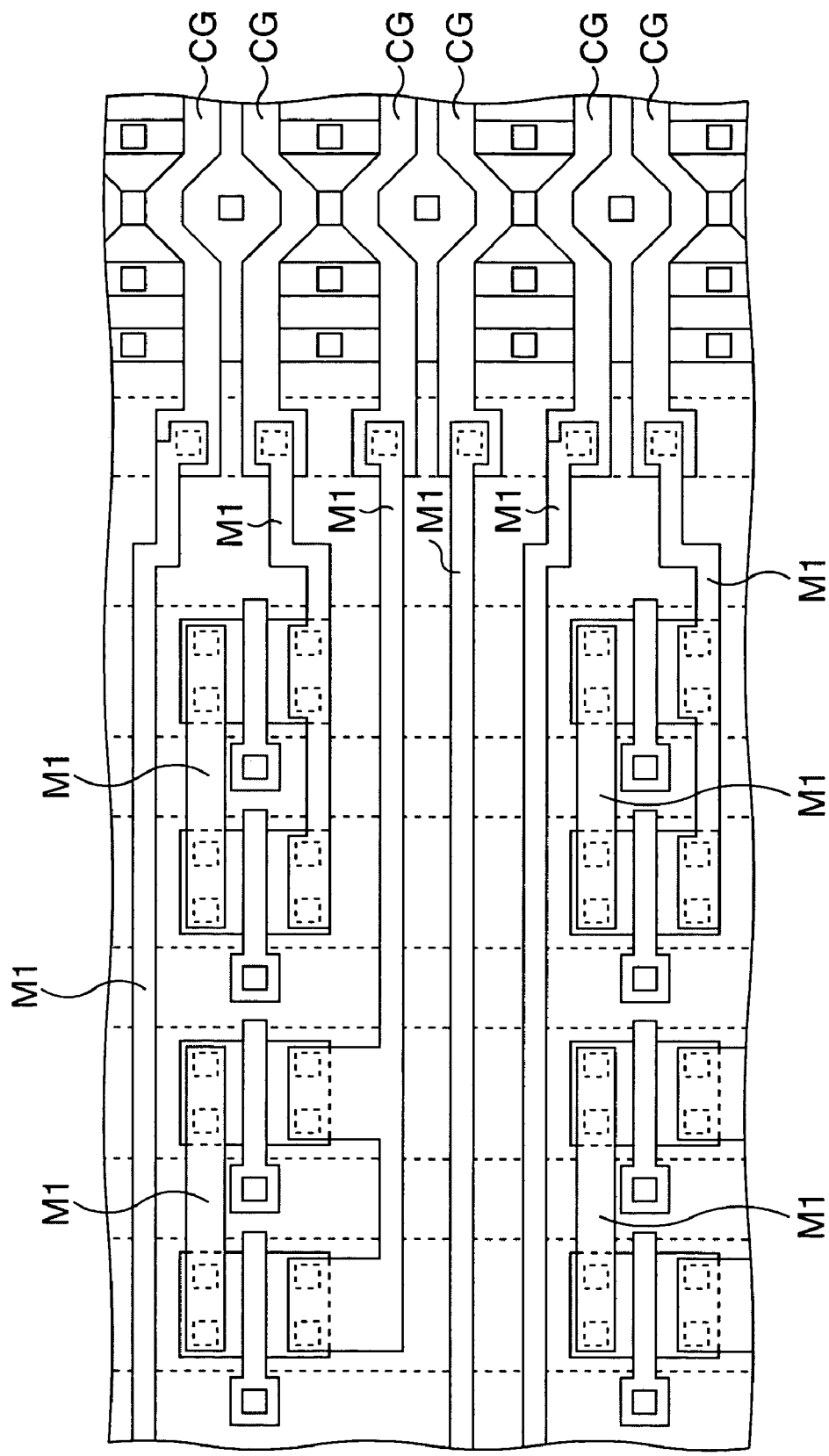
FIG. 37 is a layout view showing an example of an unattainable layout.
Figure 38:
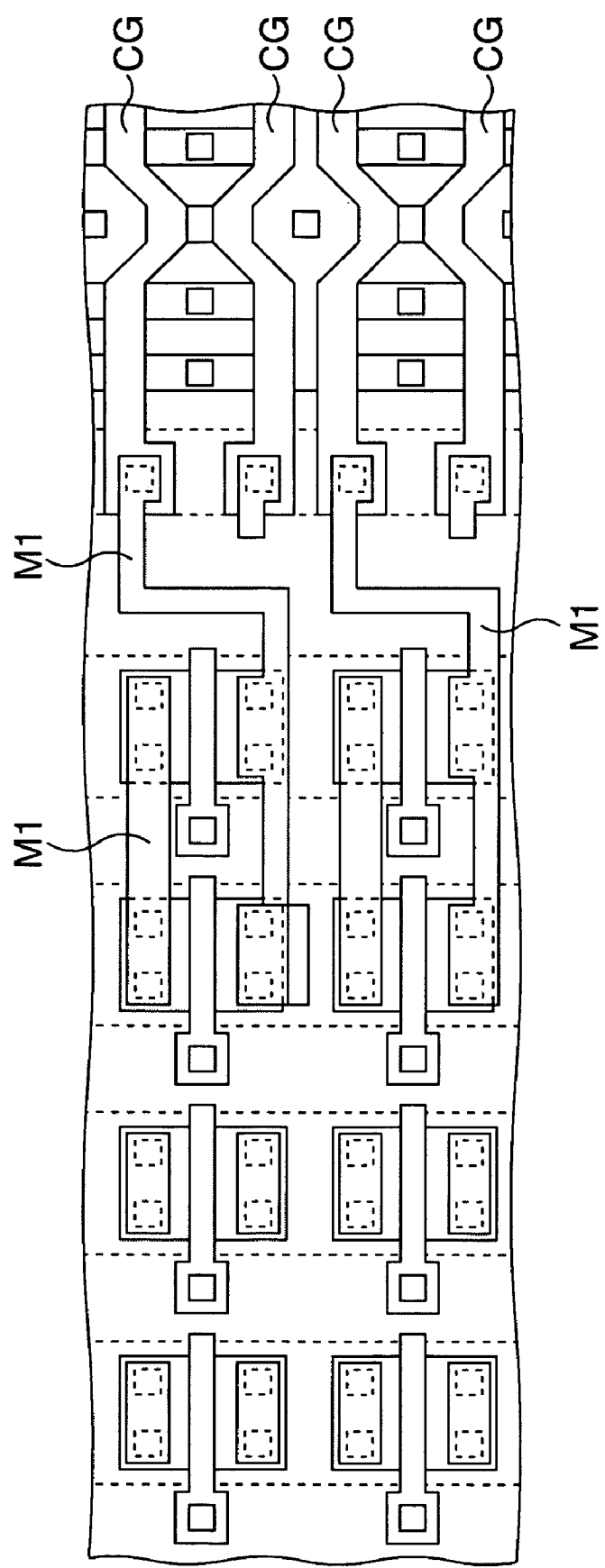
FIG. 38 is a layout view showing another example of an unattainable layout.

Conventionally, it has been studied to connect a protective diode to a nonvolatile memory such as a flash memory or the like in which memory cells are disposed in the entire chip. In such a nonvolatile chip, the pitch between wirings is quite narrow since an integration degree is valued than a number of manufacturing steps. Therefore, it is impossible, as shown in FIG. 37 or FIG. 38, to connect a control gate CG to sources or drains of nMOS transistors and the pMOS transistors via single-layer metal wirings M1 as in the embodiment described above.

According to the present invention, since an nMOS transistor and a pMOS transistors are used as protective diodes, it is possible to efficiently eliminate an electric charge which can be stored in a wiring of a nonvolatile memory and move to a control gate. Additionally, elimination of such an electric charge can restrain threshold voltage variation at manufacturing and can also restrain threshold voltage variation during use. According thereto, a reliable and high-performance semiconductor device is attained.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method for manufacturing a semiconductor device, comprising the steps of:
    forming a nonvolatile memory cell, an nMOS transistor, and a pMOS transistor on a surface of a semiconductor substrate;
    forming an interlayer insulation film covering the nonvolatile memory cell, the nMOS transistor, and the pMOS transistor;
    forming, in the interlayer insulation film, a plurality of contact holes exposing respectively a control gate of the nonvolatile memory cell, a source or a drain of the nMOS transistor, and a source or drain of the pMOS transistor; and
    forming a single-layer first wiring connecting the control gate to the sources or the drains of the nMOS transistor and the pMOS transistor, and a single-layer second wiring connecting the sources or the drains of the nMOS transistor and the pMOS transistor to each other which sources or the drains are not connected to said first wiring, via the plurality of the contact holes in a same layer,
    wherein the semiconductor device has an embedded structure.

2. The method for manufacturing a semiconductor device according to claim 1, wherein
    a plurality of the nonvolatile memory cells are formed to build a nonvolatile memory cell array, and
    the nMOS transistor and the pMOS transistor are formed as elements constituting a decoder in a control circuit to control operation of the nonvolatile memory cell array.

3. The method for manufacturing a semiconductor device according to claim 1, further comprising, after said step of forming the wiring, a step of forming a plurality of upper wirings to be connected to the control gate.

4. The method for manufacturing a semiconductor device according to claim 3, further comprising, during said step of forming the plurality of the upper wirings, a step of forming a low dielectric constant film as the interlayer insulation film.

5. The method for manufacturing a semiconductor device according to claim 3, wherein, as the upper wiring, a copper wiring is formed, and
    further comprising, during said step of forming the plurality of the upper wirings, a step of forming a silicon nitride film.

6. The method for manufacturing a semiconductor device according to claim 3, further comprising, during the step of forming the plurality of the upper wirings, a step of conducting plasma processing.

7. The method for manufacturing a semiconductor device according to claim 1, wherein said step of forming the nonvolatile memory cell, the nMOS transistor, and the pMOS transistor comprises a step of simultaneously injecting impurity ions to form a well for the nonvolatile memory cell and impurity ions to form a well for the nMOS transistor.

8. The method for manufacturing a semiconductor device according to claim 1, wherein said step of forming the nonvolatile memory cell, the nMOS transistor, and the pMOS transistor comprises a step of forming the control gate, a gate of the nMOS transistor, and a gate of the pMOS transistor from the same material.

9. The method for manufacturing a semiconductor device according to claim 8, wherein the control gate, the gate of the nMOS transistor, and the gate of the pMOS transistor are formed from a polycrystalline silicon film without impurity.

10. The method for manufacturing a semiconductor device according to claim 1, wherein said step of forming the floating gate of the nonvolatile memory comprises a step of forming an amorphous silicon film doped with phosphorus.

11. The method for manufacturing a semiconductor device according to claim 1, wherein a planar shape of the control gate is a linearly stretching shape.

12. A method for manufacturing a semiconductor device, comprising the steps of:

forming a nonvolatile memory cell, an nMOS transistor, and a pMOS transistor on a surface of a semiconductor substrate;

forming an interlayer insulation film covering the nonvolatile memory cell, the nMOS transistor, and the pMOS transistor;

forming, in the interlayer insulation film, a plurality of contact holes exposing respectively a control gate, source and drain diffusion regions of the nonvolatile memory cell, a source or a drain of the nMOS transistor, and a source or drain of the pMOS transistor; and forming a single-layer first wiring electrically connecting the control gate to both the source or drain of the nMOS transistor and the source or drain of the pMOS transistor, and a single-layer second wiring connecting the sources or the drains of the nMOS transistor and the pMOS transistor to each other which sources or the drains are not connected to said first wiring, wherein the semiconductor device has an embedded structure.

13. The method for manufacturing a semiconductor device according to claim 2, wherein, with regard to an area, an occupied rate of the nonvolatile memory cell array is 2% to 5%.

* * * * *

UNITED STATES PATENT AND TRADEMARK OFFICE
CERTIFICATE OF CORRECTION

PATENT NO.         : 7,541,236 B2                                              Page 1 of 1
APPLICATION NO.    : 11/019549
DATED              : June 2, 2009
INVENTOR(S)        : Koji Takahashi et al.

It is certified that error appears in the above-identified patent and that said Letters Patent is hereby corrected as shown below:

On the Title page:

In Item 73 change "Fujitsu Limited, Kawasaki (JP)"

To be

--FUJITSU MICROELECTRONICS LIMITED, Tokyo (JP)--

Signed and Sealed this

Third Day of November, 2009

David J. Kappos
*Director of the United States Patent and Trademark Office*